United States Patent
Szmuk et al.

(10) Patent No.: US 11,942,946 B2
(45) Date of Patent: Mar. 26, 2024

(54) FREQUENCY MANAGEMENT FOR QUANTUM CONTROL

(71) Applicant: Quantum Machines, Tel Aviv (IL)

(72) Inventors: Ramon Szmuk, Tel Aviv (IL); Lior Ella, Tel Aviv (IL); Yonatan Cohen, Tel Aviv (IL); Itamar Sivan, Tel Aviv (IL); Nissim Ofek, Tel Aviv (IL)

(73) Assignee: Quantum Machines (IL)

( * ) Notice: Subject to any disclaimer, the term of this patent is extended or adjusted under 35 U.S.C. 154(b) by 68 days.

(21) Appl. No.: 17/854,299

(22) Filed: Jun. 30, 2022

(65) Prior Publication Data

US 2022/0345120 A1    Oct. 27, 2022

Related U.S. Application Data

(63) Continuation of application No. 17/336,506, filed on Jun. 2, 2021, now Pat. No. 11,405,024, which is a continuation of application No. 16/985,454, filed on Aug. 5, 2020, now Pat. No. 11,043,939.

(51) Int. Cl.
*H03K 3/38*     (2006.01)
*G06N 10/00*    (2022.01)
*H03L 7/099*    (2006.01)

(52) U.S. Cl.
CPC .............. *H03K 3/38* (2013.01); *G06N 10/00* (2019.01); *H03L 7/099* (2013.01)

(58) Field of Classification Search
CPC ........................................ H03K 3/38
USPC ........................................ 327/307
See application file for complete search history.

(56) References Cited

U.S. PATENT DOCUMENTS

| | | | |
|---|---|---|---|
| 4,875,484 | A  | 10/1989 | Anzai et al. |
| 6,223,228 | B1 | 4/2001  | Ryan et al. |
| 6,426,984 | B1 | 7/2002  | Perino et al. |
| 6,993,108 | B1 | 1/2006  | Chi et al. |
| 7,451,292 | B2 | 11/2008 | Routt |
| 7,535,931 | B1 | 5/2009  | Zampetti et al. |
| 7,627,126 | B1 | 12/2009 | Pikalo |
| 8,315,969 | B2 | 11/2012 | Roetteler |

(Continued)

FOREIGN PATENT DOCUMENTS

| | | |
|---|---|---|
| CA | 2420022   | 2/2003 |
| CN | 104467843 | 3/2015 |

(Continued)

OTHER PUBLICATIONS

Extended European Search Report Appln No. 19889443.8 dated Aug. 4, 2022.

(Continued)

*Primary Examiner* — Tomi Skibinski
(74) *Attorney, Agent, or Firm* — McAndrews, Held & Malloy, Ltd.

(57) ABSTRACT

A system comprises quantum control interconnect circuitry configured to receive a plurality of fixed-frequency signals, a variable-frequency signal, a quantum control pulse, a quantum element readout pulse, and a quantum element return pulse. The circuitry is operable to upconvert the quantum control pulse using the fixed-frequency signals. The circuitry is operable to upconvert the readout pulse using the variable-frequency signal. The circuitry is operable to downconvert the return pulse using the variable-frequency signal.

21 Claims, 18 Drawing Sheets

(56) References Cited

U.S. PATENT DOCUMENTS

| | | |
|---|---|---|
| 8,385,878 B2 | 2/2013 | Rao |
| 8,750,717 B1 | 6/2014 | Yap et al. |
| 9,207,672 B2 | 12/2015 | Williams |
| 9,400,499 B2 | 7/2016 | Williams |
| 9,509,324 B2 | 11/2016 | McDonald et al. |
| 9,663,358 B1 | 5/2017 | Cory et al. |
| 9,692,423 B2 | 6/2017 | McDermott, III |
| 9,847,121 B2 | 12/2017 | Frank |
| 9,858,531 B1 | 1/2018 | Monroe |
| 9,892,365 B2 | 2/2018 | Rigetti |
| 9,978,020 B1 | 5/2018 | Gambetta |
| 9,979,400 B1 | 5/2018 | Sete |
| 9,996,801 B2 | 6/2018 | Shim |
| 10,063,228 B2 | 8/2018 | Deurloo et al. |
| 10,122,351 B1 | 11/2018 | Naaman |
| 10,127,499 B1 | 11/2018 | Rigetti |
| 10,192,168 B2 | 1/2019 | Rigetti |
| 10,223,643 B1 | 3/2019 | Bishop et al. |
| 10,333,503 B1 | 6/2019 | Cohen et al. |
| 10,454,459 B1 | 10/2019 | Cohen |
| 10,496,069 B2 | 12/2019 | Nazarathy et al. |
| 10,505,524 B1 | 12/2019 | Cohen |
| 10,560,076 B1 | 2/2020 | Cohen |
| 10,637,449 B1 | 4/2020 | Cohen et al. |
| 10,659,018 B1 | 5/2020 | Cohen |
| 10,666,238 B1 | 5/2020 | Cohen |
| 10,958,253 B1 | 3/2021 | Cohen et al. |
| 10,985,739 B2 | 4/2021 | Cohen et al. |
| 11,010,145 B1 | 5/2021 | Smith et al. |
| 11,043,939 B1* | 6/2021 | Szmuk ............... H03K 3/38 |
| 11,463,075 B2 | 10/2022 | Cohen et al. |
| 11,616,497 B2 | 3/2023 | Cohen et al. |
| 11,616,498 B2 | 3/2023 | Cohen et al. |
| 2003/0090767 A1* | 5/2003 | Yap ............... H04B 10/50577 |
| | | 398/183 |
| 2004/0266084 A1 | 12/2004 | Fujishima et al. |
| 2005/0180575 A1 | 8/2005 | Maeda et al. |
| 2006/0093376 A1 | 5/2006 | Mitchell et al. |
| 2008/0037693 A1 | 2/2008 | Andrus et al. |
| 2011/0035511 A1 | 2/2011 | Biederman |
| 2013/0198499 A1 | 8/2013 | Dice et al. |
| 2016/0125311 A1 | 5/2016 | Fuechsle et al. |
| 2016/0267032 A1 | 9/2016 | Rigetti et al. |
| 2016/0292586 A1 | 10/2016 | Rigetti et al. |
| 2017/0094618 A1 | 3/2017 | Bjorkengren |
| 2017/0214410 A1 | 7/2017 | Hincks et al. |
| 2017/0364796 A1 | 12/2017 | Wiebe |
| 2018/0013426 A1 | 1/2018 | Deurloo et al. |
| 2018/0032893 A1 | 2/2018 | Epstein |
| 2018/0091244 A1 | 3/2018 | Abdo |
| 2018/0107579 A1 | 4/2018 | Chapman |
| 2018/0123597 A1 | 5/2018 | Sete |
| 2018/0237039 A1 | 8/2018 | Mong et al. |
| 2018/0260245 A1 | 9/2018 | Smith |
| 2018/0260730 A1 | 9/2018 | Reagor |
| 2018/0260732 A1 | 9/2018 | Bloom |
| 2018/0308007 A1 | 10/2018 | Amin |
| 2018/0322409 A1 | 11/2018 | Barends |
| 2018/0365585 A1 | 12/2018 | Smith |
| 2018/0373995 A1 | 12/2018 | Tomaru et al. |
| 2018/0375650 A1 | 12/2018 | Legre |
| 2019/0042964 A1 | 2/2019 | Elsherbini et al. |
| 2019/0042965 A1 | 2/2019 | Clarke |
| 2019/0042970 A1 | 2/2019 | Zou |
| 2019/0042971 A1 | 2/2019 | Zou |
| 2019/0042972 A1 | 2/2019 | Zou |
| 2019/0042973 A1 | 2/2019 | Zou |
| 2019/0049495 A1 | 2/2019 | Ofek |
| 2019/0251478 A1 | 8/2019 | Bishop et al. |
| 2019/0266512 A1 | 8/2019 | Shen et al. |
| 2019/0302832 A1 | 10/2019 | Morgan et al. |
| 2019/0385088 A1 | 12/2019 | Naaman et al. |
| 2020/0293080 A1 | 9/2020 | Poon et al. |
| 2020/0364602 A1 | 11/2020 | Niu et al. |
| 2021/0004707 A1 | 1/2021 | Gambetta et al. |
| 2021/0103847 A1 | 4/2021 | Akzam |
| 2021/0125096 A1 | 4/2021 | Puri et al. |

FOREIGN PATENT DOCUMENTS

| | | |
|---|---|---|
| CN | 105281886 A | 1/2016 |
| CN | 105912070 A | 8/2016 |
| CN | 108111306 A | 6/2018 |
| CN | 110085094 A | 8/2019 |
| CN | 110677210 | 1/2020 |
| CN | 111464154 A | 7/2020 |
| CN | 111767055 A | 10/2020 |
| CN | 112019193 A | 12/2020 |
| CN | 112149832 A | 12/2020 |
| EP | 0388052 | 9/1990 |
| JP | 2011175078 A | 9/2011 |
| JP | 2012188875 | 10/2012 |
| WO | 2015178991 A2 | 11/2015 |
| WO | 2015178992 A2 | 11/2015 |
| WO | 2017078735 A1 | 5/2017 |
| WO | 2017123940 | 7/2017 |
| WO | 2017139683 A1 | 8/2017 |
| WO | 2018055607 | 3/2018 |
| WO | 2018062991 A1 | 4/2018 |
| WO | 2019063117 A1 | 4/2019 |
| WO | 2020033807 A1 | 2/2020 |
| WO | 2020231795 A1 | 11/2020 |
| WO | 2021/123903 | 6/2021 |

OTHER PUBLICATIONS

Int'l Search Report and Written Opinion Appln No. PCT/IB2022/054903 dated Sep. 8, 2022.

Int'l Preliminary Report on Patentability Appln No. PCT/IB2021/000067 dated Sep. 22, 2022.

Int'l Search Report and Written Opinion Appln No. PCT/IB2022/053304 dated Oct. 6, 2022.

Serrano, Javier, M. Lipinski, T. Wlostowski, E. Gousiou, Erik van der Bij, M. Cattin, and G. Daniluk. "The white rabbit project." (2013) Sep. 19, 2013 (Sep. 19, 2013) Entire document.

Extended European Search Report Appln No. 19910800.2 dated Oct. 6, 2022.

Hornibrook J M et al: "Cryogenic Control Architecture for Large-Scale Quantum Computing", arxiv.org, Cornell University Library, 201 Olin Library Cornell University Ithaca, NY 14853, Sep. 8, 2014 (Sep. 8, 2014), XP081391509.

Fu X et al: "An Experimental Microarchitecture for a Superconducting Quantum Processor", MICRO-50 '17: Proceedings of the 50th Annual IEEE/ACM International Symposium on Microarchitecture, Cornell University Library, 201 Olin Library Cornell University Ithaca, NY 14853, Oct. 14, 2017 (Oct. 14, 2017), pp. 1-13, XP081291220.

Zopes J. et al: "High resolution quantum sensing with shaped control pulses", arxiv.org, Cornell University Library, 201 Olin Library Cornell University Ithaca, NY 14853, May 22, 2017 (May 22, 2017), XP081276850.

Cross et al. "Open Quantum Assembly Language", Jan. 10, 2017.

European Office Communication with extended Search Report Appln No. 20766036.6 dated Nov. 24, 2022.

Japanese Patent Office Action Appln No. 2021-529723 dated Oct. 26, 2022 with translation.

U.S. Appl. No. 62/294,966, filed Feb. 12, 2016.

Int'l Search Report and Written Opinion Appln No. PCT/IB2019/001410 dated Jun. 10, 2020.

Int'l Search Report and Written Opinion Appln No. PCT/IB2019/001394 dated Jun. 17, 2020.

Zhang J, Hegde SS, Suter D. Pulse sequences for controlled 2-and 3-qubit gates in a hybrid quantum register. arXiv preprint arXiv:1806.08408. Jun. 21, 2018.

Wang CY, Kuznetsova L, Gkortsas VM, Diehl L, Kaertner FX, Belkin MA, Belyanin A, Li X, Ham D, Schneider H, Grant P. Mode-locked pulses from mid-infrared quantum cascade lasers. Optics Express. Jul. 20, 2009;17(15):12929-43.

(56) References Cited

OTHER PUBLICATIONS

Int'l Search Report and Written Opinion Appln No. PCT/IB2020/000218 dated Aug. 11, 2020.
Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).
Int'l Search Report and Written Opinion Appln No. PCT/IB2020/000376 dated Sep. 17, 2020.
Breitfelder et al. eds., IEEE 100: The Authoritative Dictionary of IEEE Standards Terms 1247, definition 2 of "variable" (7th ed. 2000). (Year: 2000).
Int'l Search Report and Written Opinion Appln No. PCT/IB2020/000707 dated Jan. 12, 2021.
National Academies of Sciences, Engineering, and Medicine. "Quantum Computing: Progress and Prospects". eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5, Qiskit Backend Specifications at footnote 57: section 4.2, 5.1.5, Fig. 3, Fig. 4 , pp. 30, 57.
IBM Research. "Qiskit Backend Specifications for OpenQASM and OpenPulse Experiments". eprint arXiv:1809.03452v1 (Sep. 10, 2018) [online]. [retrieved on Jan. 7, 2020]. retrieved from: <https://arxiv.org/pdf/1809.03452.pdf> Sep. 10, 2018 (Sep. 10, 2018) section 4.2, 5.1.5, Fig. 3, Fig. 4 , pp. 30, 57.
Int'l Search Report and Written Opinion Appln No. PCT/IB2020/000704 dated Jan. 17, 2021.
Wolfowicz, et al. Pulse Techniques for Quantum Information Processing University of Chicago, University College London, eMagRes, 2016, vol. 5: 1515-1528. DOI 10.1002/9780470034590.emrstm1521.
Int'l Search Report and Written Opinion Appln No. PCT/IB2020/000555 dated Dec. 27, 2020.
Int'l Search Report and Written Opinion Appln No. PCT/IB2020/000760 dated Jan. 27, 2021.
"Quantum-classical interface based on single flux quantum digital logic". In: Quantum Science and Technology 3.2 (2018), pp. 1-16. DOI: 10.1088/2058-9565/aaa3a0.(retrieved on Jan. 20, 2021). Retrieved from the Internet: <https://arxiv.org/pdf/1710.04645.pdf> McDermott R. et al. Oct. 12, 2017 (Oct. 12, 2017) Section VI, VII, VIII.
Roffe, J., Quantum Error Correction: An Introductory Guide, Dept. of Physics & Astronomy, Univ. of Sheffeld, UK, Oct. 10, 2019, pp. 1-29.
Int'l Search Report and Written Opinion Appln No. PCT/IB2020/001004 dated May 13, 2021.
Int'l Preliminary Report on Patentability Appln No. PCT/IB2019/001410 dated Jun. 10, 2021.
Int'l Search Report and Written Opinion Appln No. PCT/IB2021/000067 dated Jun. 21, 2021.
Int'l Preliminary Report on Patentability Appln No. PCT/IB2019/001394 dated Jul. 29, 2021.
Int'l Preliminary Report on Patentability Appln No. PCT/IB2020/000218 dated Sep. 16, 2021.
Int'l Preliminary Report on Patentability Appln No. PCT/IB2020/000376 dated Nov. 12, 2021.
Int'l Search Report and Written Opinion Appln No. PCT/IB2021/056254 dated Dec. 1, 2021.
Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).
Int'l Preliminary Report on Patentability Appln No. PCT/IB2020/000555 dated Feb. 10, 2022.
Int'l Preliminary Report on Patentability Appln No. PCT/IB2020/000707 dated Mar. 17, 2022.
Int'l Preliminary Report on Patentability Appln No. PCT/IB2020/000704 dated Mar. 17, 2022.
Int'l Preliminary Report on Patentability Appln No. PCT/IB2020/000760 dated Apr. 7, 2022.
Int'l Search Report and Written Opinion Appln No. PCT/IB2022/050190 dated Apr. 11, 2022.
Int'l Search Report and Written Opinion Appln No. PCT/IB2022/000059 dated Jul. 7, 2022.
Moreira , "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).
Int'l Preliminary Report on Patentability Appln No. PCT/IB2020/001004 dated Jun. 30, 2022.
Int'l Search Report and Written Opinion Appln No. PCT/IB2022/000024 dated Jul. 18, 2022.
Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, pp. 259-264 (2021) Baier Simon Apr. 16, 2021 (Apr. 16, 2021).
Int'l Search Report and Written Opinion Appln No. PCT/IB2022/000068 dated Jul. 17, 2022.
D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).

* cited by examiner

FREQUENCY MANAGEMENT FOR QUANTUM CONTROL

PRIORITY CLAIM

The present application is a continuation of application Ser. No. 17/336,506 filed on Jun. 2, 2021, which is a continuation of application Ser. No. 16/985,454 filed on Aug. 5, 2020 (U.S. Pat. No. 11,043,939) The aforementioned documents are hereby incorporated herein by reference in their entirety.

BACKGROUND

Limitations and disadvantages of conventional approaches to generating signals for control of quantum elements will become apparent to one of skill in the art, through comparison of such approaches with some aspects of the present method and system set forth in the remainder of this disclosure with reference to the drawings.

BRIEF SUMMARY

Methods and systems are provided for frequency management for quantum control, substantially as illustrated by and/or described in connection with at least one of the figures, as set forth more completely in the claims.

DETAILED DESCRIPTION

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Figure 1A:
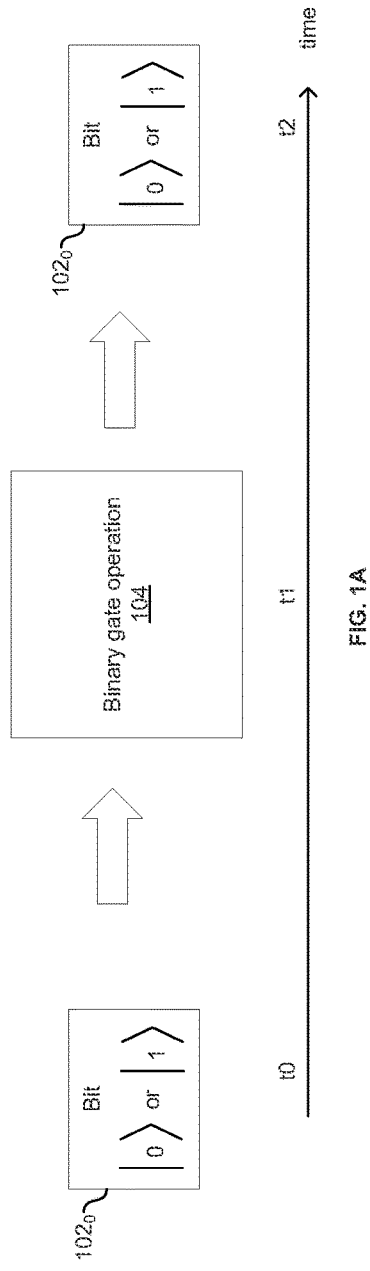
FIGS. 1A and 1B compare some aspects of classical (binary) computing and quantum computing.

Shown in FIG. 1A is a simple example of a classical computer configured to a bit 102 and apply a single logic operation 104 to the bit 102. At time t0 the bit 102 is in a first state, at time t1 the logic operation 104 is applied to the bit 102, and at time t2 the bit 102 is in a second state determined by the state at time t0 and the logic operation. So, for example, the bit 102 may typically be stored as a voltage (e.g., 1 Vdc for a "1" or 0 Vdc for a "0") which is applied to an input of the logic operation 104 (comprised of one or more transistors). The output of the logic gate is then either 1 Vdc or 0 Vdc, depending on the logic operation performed.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle + \beta|1\rangle$, where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. $|0\rangle$ and $|1\rangle$ can also be represented by two-dimensional basis vectors [1 0] and [0 1], respectively, and then the qubit state is represented by [$\alpha$ $\beta$]. The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers (in fact some problems that are intractable for classical computers may become trivial for quantum computers).

Figure 1B:
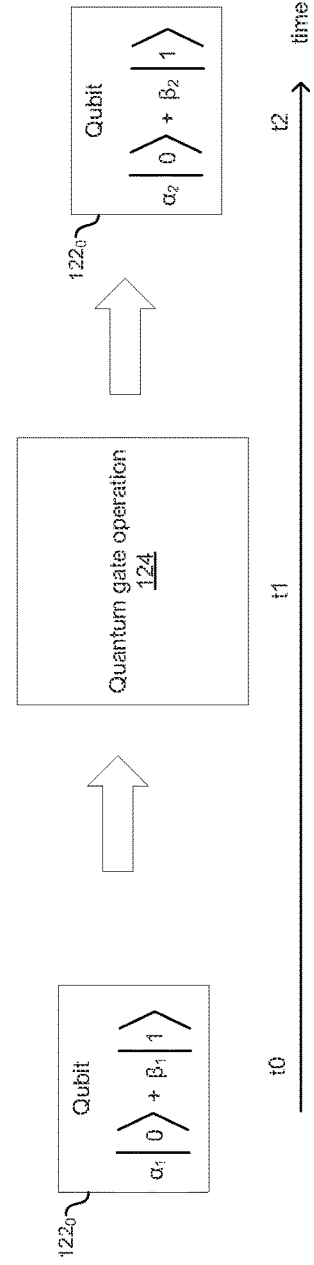

Shown in FIG. 1B is a simple example of a quantum computer configured to store a qubit 122 and apply a single quantum gate operation 124 to the qubit 122. At time t0 the qubit 122 is described by $\alpha_1|0\rangle+\beta_1|1\rangle$, at time t1 the logic operation 124 is applied to the qubit 122, and at time t2 the qubits 122 is described by $\alpha_2|0\rangle+\beta_2|1\rangle$.

Unlike a classical bit, a qubit cannot be stored as a single voltage value on a wire. Instead, a qubit is physically realized using a two-level quantum mechanical system. Many physical implementations of qubits have been proposed and developed over the years with some being more promising than others. Some examples of leading qubits implementations include superconducting circuits, spin qubits, and trapped ions.

It is the job of the quantum controller to generate the precise series of external signals, usually pulses of electromagnetic waves and pulses of base band voltage, to perform the desired logic operations (and thus carry out the desired quantum algorithm). Example implementations of a quantum controller are described in further detail below.

Figure 2A:
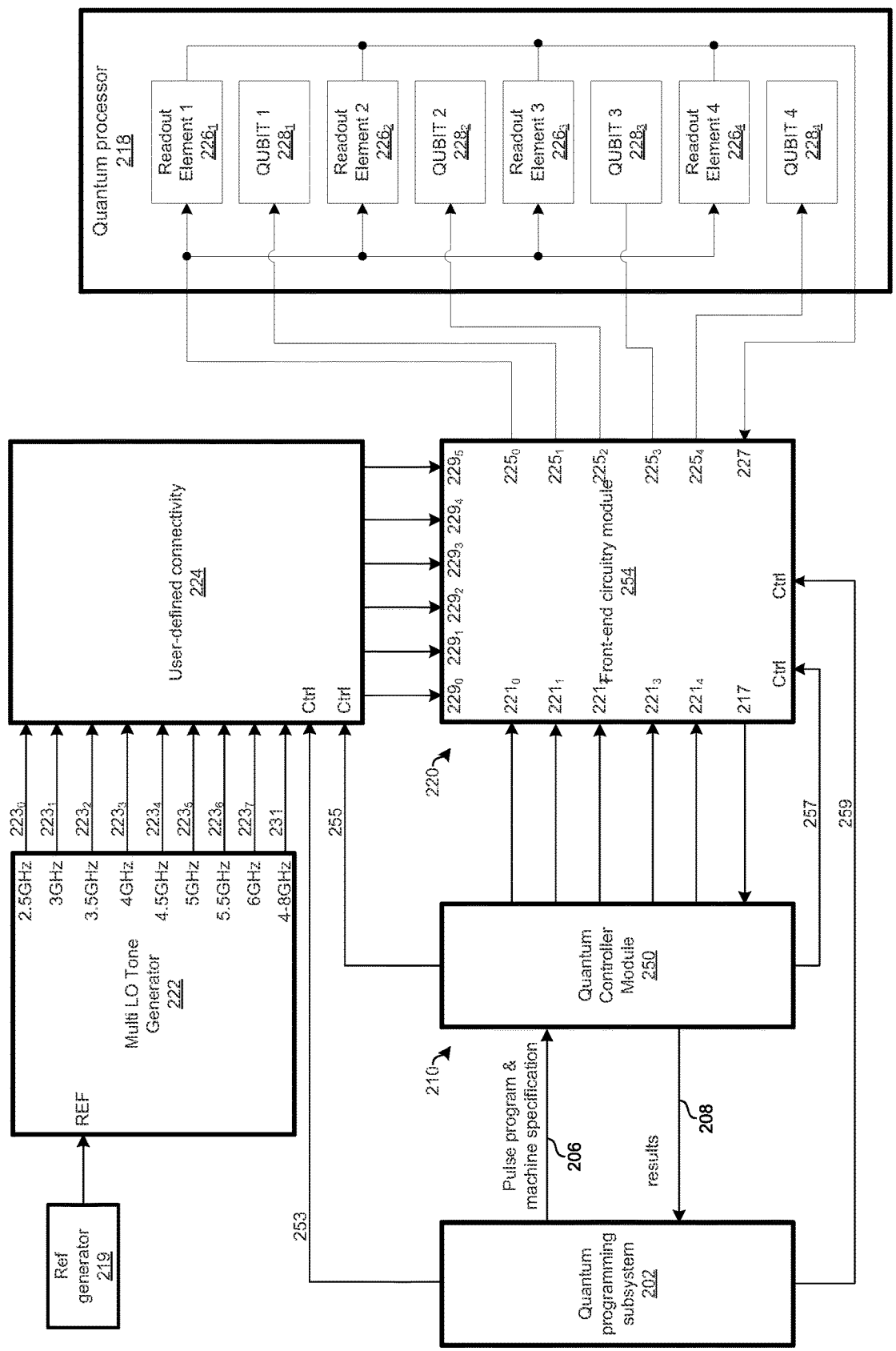
FIGS. 2A-2D illustrate example configurations of a quantum orchestration platform.
Figure 2B:
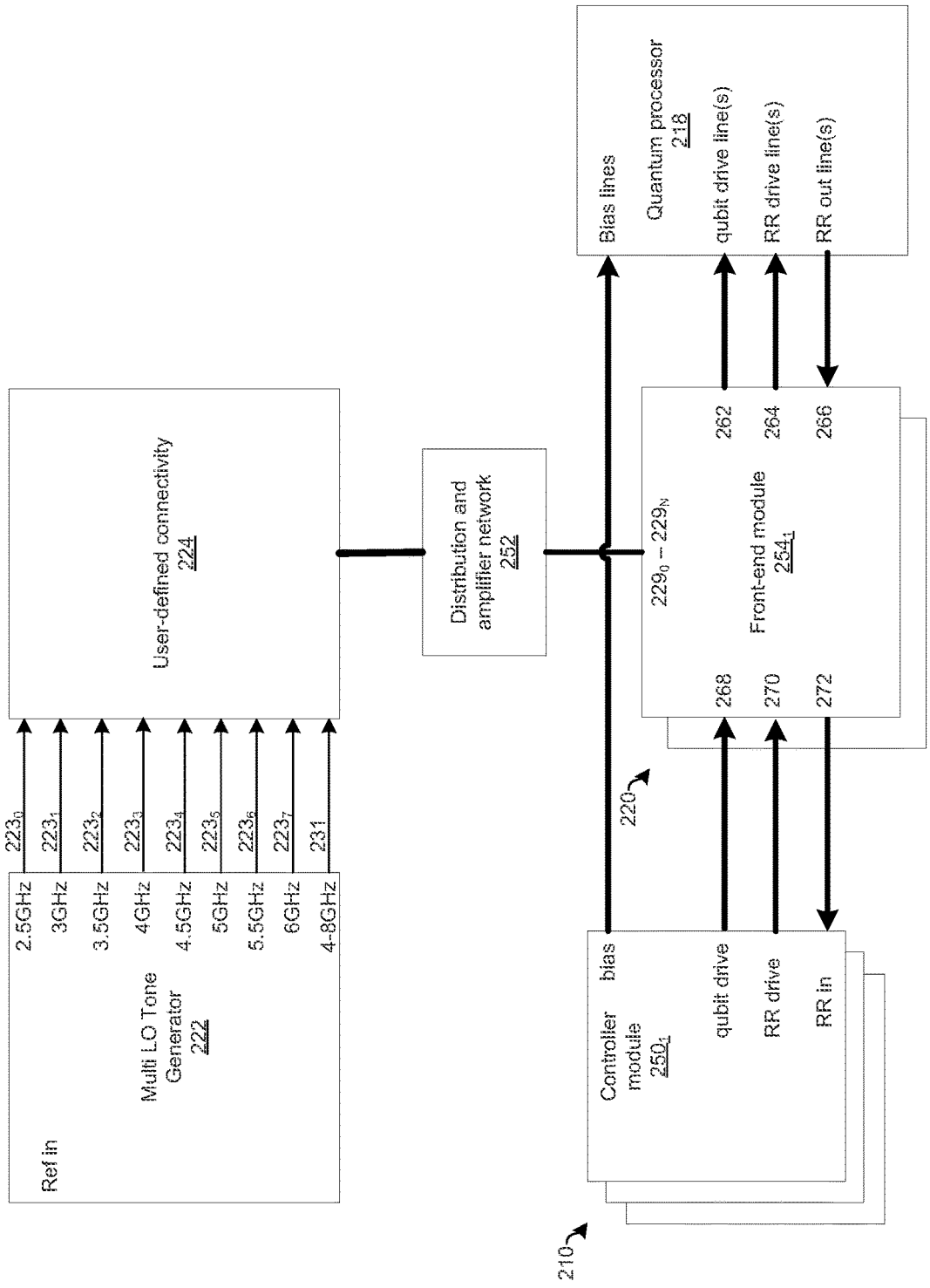
Figure 2C:
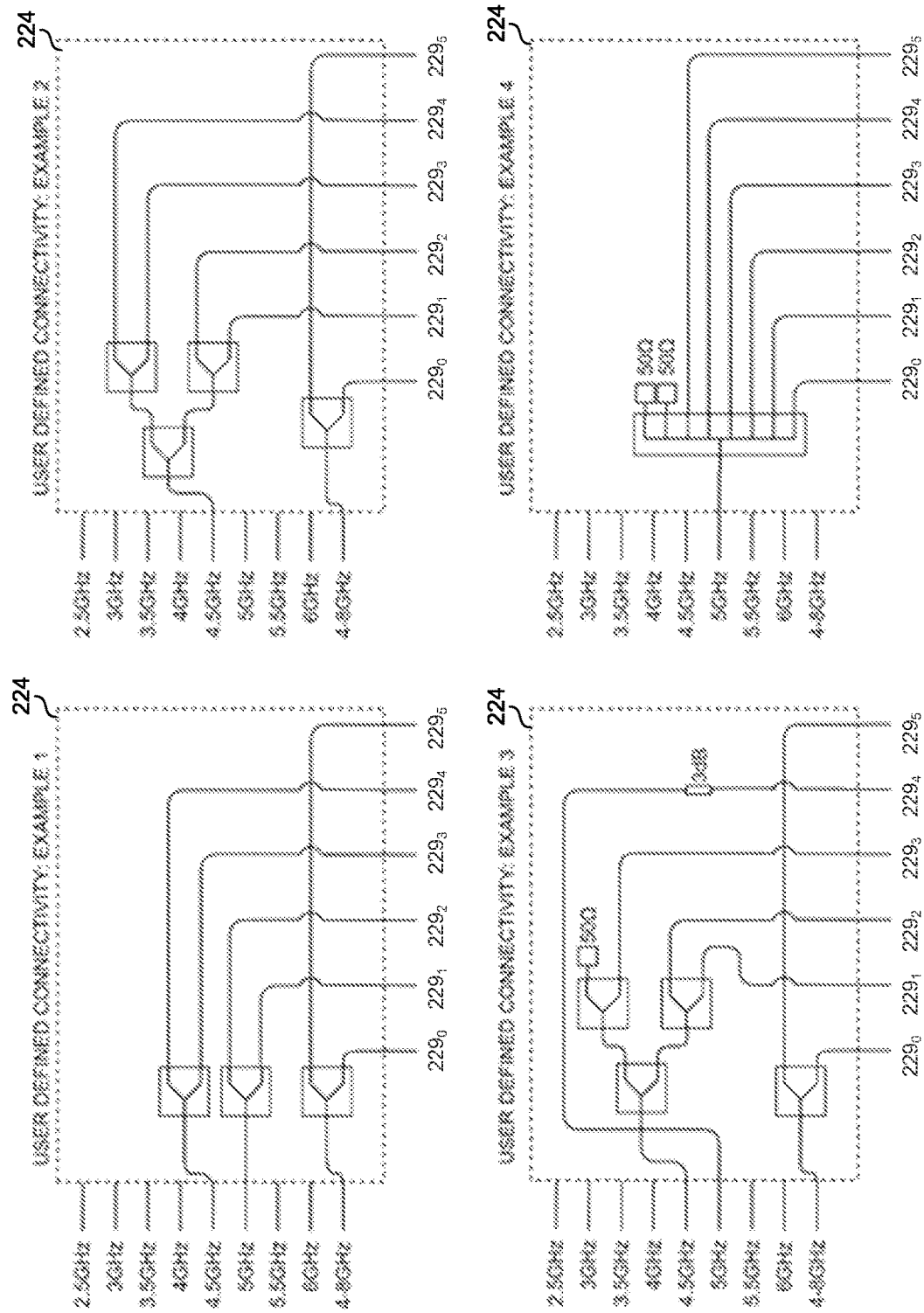

FIGS. 2A-2C illustrate example configurations of a quantum orchestration platform (QOP). The QOP comprises a quantum programming subsystem 202, a quantum controller 210, front-end circuitry 254, multi-LO tone generator 222, connectivity circuitry 224, and a quantum processor 218.

The quantum programming subsystem 202 comprises circuitry operable to generate a pulse generation program and quantum machine specification 206 which configures the quantum controller 210 and includes instructions the quantum controller 210 can execute to carry out the quantum algorithm (i.e., generate the necessary outbound quantum control pulse(s)) with little or no human intervention during runtime. In an example implementation, the quantum programming system 202 is a personal computer comprising a processor, memory, and other associated circuitry (e.g., an x86 or x64 chipset) having installed on it a quantum orchestration software development kit (SDK) that enables creation (e.g., by a user via a text editor and/or by automated pulse program generation circuitry) of a high-level (as opposed to binary or "machine code") pulse generation program. In an example implementation, the high-level pulse generation program and quantum machine specification use a high-level programming language (e.g., Python, R, Java, Matlab, etc.) simply as a "host" programming language in which are embedded the QOP programming constructs.

The quantum machine specification and pulse generation program may be part of one or more larger databases and/or contained in one or more files (e.g., each may take the form of a plain-text file recognizable by an operating system such as Windows, Linux, Mac, or another OS) on which quantum programming subsystem runs. The quantum programming subsystem 202 then compiles the high-level pulse generation program and machine specification to machine code (i.e., series of binary vectors that represent instructions that the quantum controller's hardware can interpret and execute directly).

The quantum programming subsystem 202 is coupled to the quantum controller 210 via any suitable wired, wireless, and/or optical link(s). The quantum controller 210 comprises circuitry operable to load the machine code from the programming subsystem 202, and then execute the machine code to generate the necessary outbound quantum control pulse(s) that correspond to the desired operations to be performed on the quantum processor 218 (e.g., sent to qubit(s) for manipulating a state of the qubit(s) or to readout resonator(s) for reading the state of the qubit(s), etc.) and/or process inbound pulses returning from the quantum processor 218 via front-end circuitry 254. Depending on the pulse program being executed, whether to transmit one or more outbound pulse and/or characteristics of one or more outbound pulse to be transmitted may be predetermined at design time and/or may be determined during runtime. The runtime determination of the pulses may comprise performance of classical calculations and processing in the quantum controller 210 and/or the quantum programing subsystem 202 during runtime of the algorithm (e.g., runtime analysis of inbound pulses received from the quantum processor 218 via front-end circuitry 254).

During runtime of a pulse program and/or upon completion of a pulse program, the quantum controller 210 may output data/results to the quantum programming subsystem 202. In an example implementation these results may be used to update the source and/or machine code of the pulse program and/or specification.

The quantum controller 210 is coupled to front-end circuitry 254 via any suitable wired, wireless, and/or optical link(s). As shown in FIG. 2B, the quantum controller 210 may comprise a plurality of interconnected, but physically separate quantum control modules 250 (e.g., each module being a separate IC, PCB, or desktop or rack mounted device) such that quantum control systems requiring relatively fewer resources can be realized with relatively fewer quantum control modules and quantum control systems requiring relatively more resources can be realized with relatively more quantum control modules. The number of quantum control modules 250 needed for a particular quantum system may be determined based on the number of qubits of the quantum processor 218 and their architecture (tunability, connectivity, coupling elements and readout architecture).

In general, the quantum processor 218 comprises K (an integer) quantum elements 122, which includes qubits (which could be of any type such as superconducting, spin qubits, ion trapped, etc.), and, where applicable, any other element(s) for processing quantum information, storing quantum information (e.g. storage resonator), and/or coupling outbound quantum control pulses from front-end circuitry 254 and inbound quantum control pulses to the front-end circuitry 254. In the example shown, in FIG. 2A, K=8 and the quantum processor 218 comprises 4 readout elements 226 and 4 qubits 228. In FIG. 2B, port(s) 262 represent RF output ports via which pulses are sent to qubits of the quantum processor (in the example of FIG. 2A, 262 corresponds to $225_1$-$225_4$). In FIG. 2B, port(s) 264 represent RF output ports via which pulses are sent to readout elements of the quantum processor (in the example of FIG. 2A, 266 corresponds to 227). In FIG. 2B, port(s) 266 represent RF input ports via which pulses are received from the readout elements of the quantum processor (in the example of FIG. 2A, 264 corresponds to 227). In FIG. 2B, port(s) 268 represent IF input ports via which pulses to be sent to qubits of the quantum processor 218 are received from a controller module 250 (in the example of FIG. 2A, 268 corresponds to one or more of $221_0$-$221_4$). In FIG. 2B, port(s) 270 represent IF input ports via which pulses to be sent to readout elements of the quantum processor 218 are received from a controller module 250 (in the example of FIG. 2A, 268 corresponds to one or more of $221_0$-$221_4$). In FIG. 2B, port(s) 272 represent IF output ports via which pulses from readout elements are sent to controller module 250 (in the example of FIG. 2A, 272 corresponds to 223).

Figure 2D:
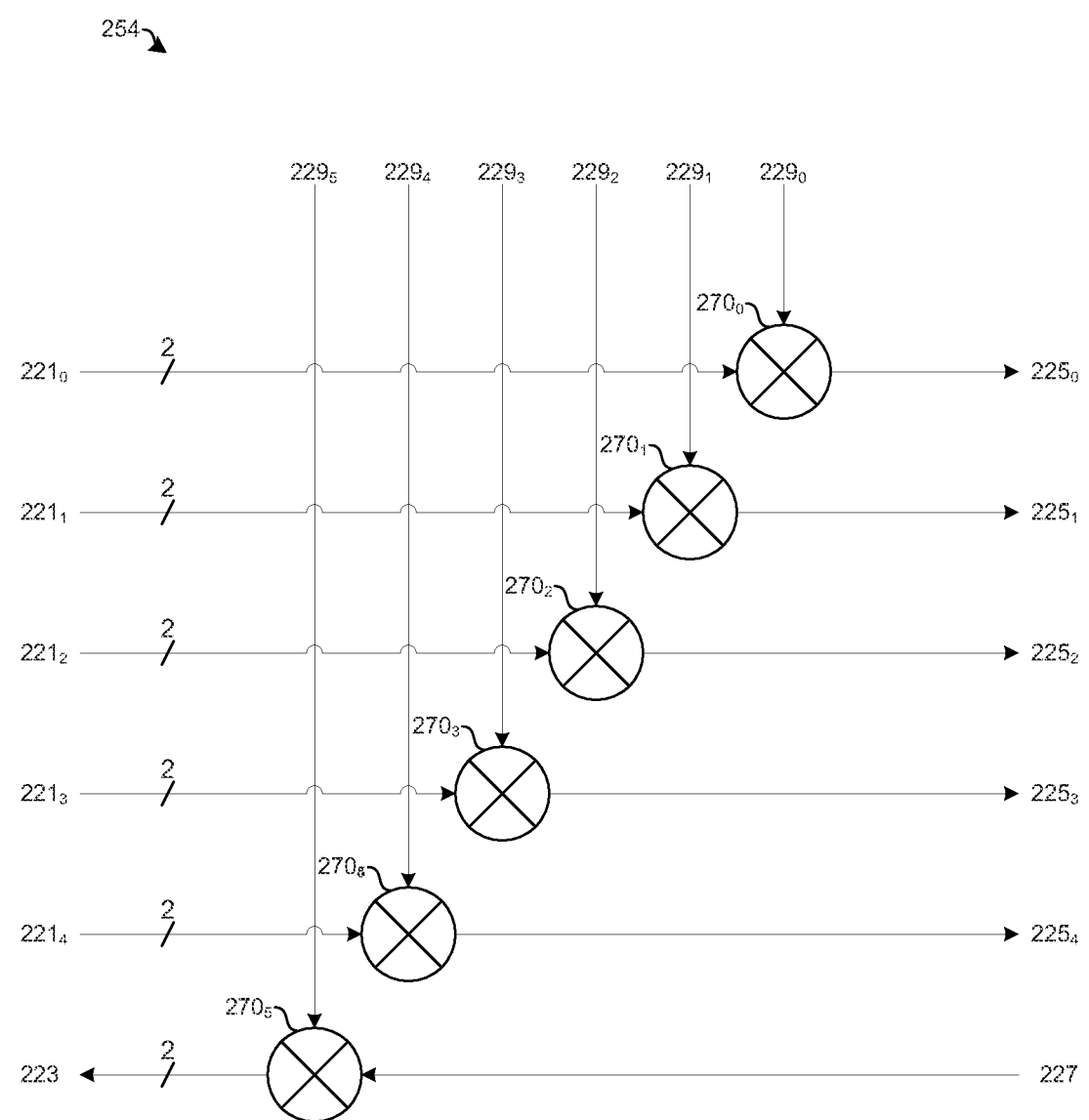

The front-end circuitry 254 is operable to receive outbound intermediate frequency (IF) pulses from quantum controller 210 via one or more ports 221, upconvert the IF pulses to RF using the local oscillator signals received via one or more LO ports 229, and output the RF pulses to quantum processor 218 via one or more output ports 225. Each IF input port 221 is configured to receive an independent pulse or multi-pulse pair (e.g., an IQ pair of pulses comprising an in-phase pulse and quadrature-phase pulse). In the latter case, the front-end circuitry 254 is operable to perform IQ upconversion. In the example shown, Five IF input ports $221_0$-$221_4$, five RF output ports $225_0$-$225_4$, one RF input port 227, one IF output port 217, and six LO input ports $229_0$-$229_5$ were chosen merely as an example. Other implementations may have any number of RF, IF, and LO input ports and any number of RF and IF output ports. As shown in FIG. 2B, the front-end circuitry 254 may comprise a plurality of interconnected, but physically separate front-end circuitry modules (e.g., each module being a separate IC, PCB, or desktop or rack mounted device) such that quantum control systems requiring relatively fewer resources can be realized with relatively fewer front-end circuitry modules and quantum control systems requiring relatively more resources can be realized with relatively more front-end circuitry modules. The number of front-end circuitry modules needed for a particular quantum system may be determined based on the number of qubits of the quantum processor 218 and their architecture (tunability, connectivity, preparation, trapping, coupling elements and readout architecture). In the example implementation shown in FIG. 2D, the circuitry 254 comprises 6 IQ mixers 270. Each of mixers $270_0$-$270_4$ receives an IQ pair of IF signals via a respective one of ports $221_0$-$221_4$, and uses an LO signal received via a respective one of ports $229_0$-$229_4$ to upconvert the IQ pair to a corresponding RF signal output via a respective one of ports $225_0$-$225_4$. The mixer $270_5$ uses the LO received via port $229_5$ to downconvert the RF signal received via port 227 to generate the IF IQ pair output via port 217. In an example implementation, the front-end circuitry 254 is configured manually and/or programmatically via digital control signals. For example, a signal 259 from the quantum programming subsystem 202 and/or a signal 257 from the quantum controller module 250 may open and close switching elements of the circuitry 254, adjust gains within the circuitry 254, adjust coefficients of filters within the circuitry 254, and/or otherwise configure the RF, IF, and/or LO signal paths of circuitry 254.

The multi-tone generator 222 is operable to generate one or more signals at one or more desired frequencies, which will typically be dictated by the particular quantum processor 218 (e.g., based on the resonant frequencies of quantum elements of the quantum processor 218). In an example implementation, two types of outputs are provided by quantum multi-tone generator 222: (1) one or more fixed frequency continuous wave (CW) tones 223; and (2) one or more synthesized frequency signals 231.

Each of the tone(s) 223 may be a single, fixed frequency tone with a power fixed at, for example, +23 dBm. Assuming a tolerable LO power of +14 to +20 dBm, this allows splitting a tone 223 into up to six LO signals using a suitable power splitting circuit, without any additional active RF components. For an implementation generating multiple tones 223, the tones may be multiples of a single base tone fi. For example, in the implementation shown, there are eight tones with f0=500 MHz and thus the tones 223 range from 2.5 GHz to 6 GHz in steps of 500 MHz. This, together with the ability of the quantum controller 210 to accurately and dynamically control the frequencies of IF pulses it generates (see e.g., FIGS. 6A and 6B, below), enables addressing qubits within a band of frequencies that covers all currently known and proposed superconducting qubit implementations. Of course, different and/or other frequencies can be used to accommodate different qubit implementations.

The synthesized signal or signals 231 output an adjustable frequency RF tone within a band of frequencies that contains, for example, the band 4 GHz to 8 GHz. This, together with the ability of the quantum controller 210 to accurately and dynamically control the frequencies of IF pulses it generates (see e.g., FIGS. 6A and 6B, below), enables, for example, addressing various readout elements that use a wide range of frequencies. Of course, different and/or other frequencies can be used to accommodate different qubit implementations.

FIG. 2A provides an illustrative example in which quantum processor 218 comprises four qubits 228 with no tunability, and four readout elements 226 (e.g., superconducting resonators) addressed by the same control line from port $225_0$. In this case, the QOP requires only a single quantum controller module 250, only a single front-end circuitry module with six mixers, and a single multi-tone generator 222. FIG. 2B shows a more generalized QOP comprising multiple front-end modules 254 and multiple controller modules 250. This illustrates the ability of a single instance of the multi-tone generator 222 to generate N (an integer) LO signals for driving a large number (e.g., 10 s or 100 s) of quantum elements with the use of appropriate RF signal distribution circuitry 252 and front-end circuitry 254. The distribution circuitry 252 may comprise suitable transmission lines, amplifiers, filters, etc.

The connectivity circuitry 224 is operable to couple the outputs of the multi-tone generator 222 to the inputs of the front-end circuitry 254. The connectivity circuitry 224 can connect any one or more of the signals $223_0$-$223_7$ and 231 to any one or more of the input ports $229_0$-$229_5$ of front-end circuitry 254. Because the desired connections between multi-tone generator 222 and quantum processor 218 depends on the architecture and operating frequencies of the quantum processor 218, the connectivity circuitry 224 is configurable by the user to support whatever configurations users may need for their particular quantum algorithms and particular quantum processor 218. The configuration may be controlled manually and/or programmatically. For example, the signal 253 from the quantum programming subsystem 202 and/or a signal 255 from the quantum controller module 250 may configure signal paths within circuitry 224 (e.g., by opening and closing switches, adjusting gains, adjusting filter coefficients, and/or the like). FIG. 2C shows an example of four such connectivity options. Examples 1, 2 and 3 are directly compatible with the setup in FIG. 2A. In example 1, the 4.5 GHz signal is connected to LO input ports $229_3$ and $229_4$, the 5 GHz signal is connected to LO input ports $229_1$ and $229_2$, and the synthesized 4-8 GHz tone is connected to $229_0$ and $229_5$. The 4.5 GHz signal received via ports $229_3$ and $229_4$ may be used to upconvert pulses to be sent to two qubits 228 having resonant frequencies in, for example, the 4.1 GHz to 4.9 GHz band. The 5 GHz signal received via ports $229_1$ and $229_2$ may be used to upconvert the pulses to be sent to two qubits 228 having resonant frequencies in the 4.6 GHz to 5.4 GHz band, for example. In example 2, the 4.5 GHz signal is connected to LO input ports $229_1$-$229_4$, and the synthesized 4-8 GHz tone is connected to $229_0$ and $229_5$. The 4.5 GHz signal received via ports $229_1$-$229_4$ may be used to upconvert pulses to be sent to four qubits having resonant frequencies in the 4.1 GHz to 4.9 GHz band. Example 3 shows using an attenuator to keep LO signal power below an upper limit when an LO drives only a single port 229. In each of examples 1, 2, and 3, the 4-8 GHz synthesized signal may be used for upconversion of the readout element control signal that is output via port $225_0$, and for downconversion of the readout element return signal received via port 227. Example 4 shows driving all 6 LO ports 229 of the front end circuit 220 with a single fixed frequency source.

The reference generator circuit 219 provides a reference signal that the multi-tone generator 222 splits, frequency multiplies, amplifies and filters to generate signals $223_0$-

$223_7$ and 231. In an example implementation, the low-phase-noise reference generator 219 is an oven-controlled crystal oscillator (OCXO) or other low-phase-noise reference generator 219.

In general, the spacing of frequency-adjacent ones of the signals 223 (e.g., assuming increasing frequency from $223_0$ to $223_7$, the spacing between $223_0$ and $223_1$, between $223_1$ and $223_2$, and so on) is based on the tuning range of the quantum controller module 250. In the example above, the quantum controller module 250 is assumed capable of tuning the IF pulses over a bandwidth of 500 MHz, thus spacing of 500 MHz or less between frequency adjacent ones of the signals $223_0$-$223_7$ enables outputting a pulse at any frequency 500 MHz below the frequency of $223_0$ to the frequency of $223_7$ plus 500 MHz. As another example, where the quantum controller module 250 is operable to tune the IF over 1 GHz then frequency adjacent ones of the signals $223_0$-$223_7$ may be separated by up to 1 GHz.

Figure 3:
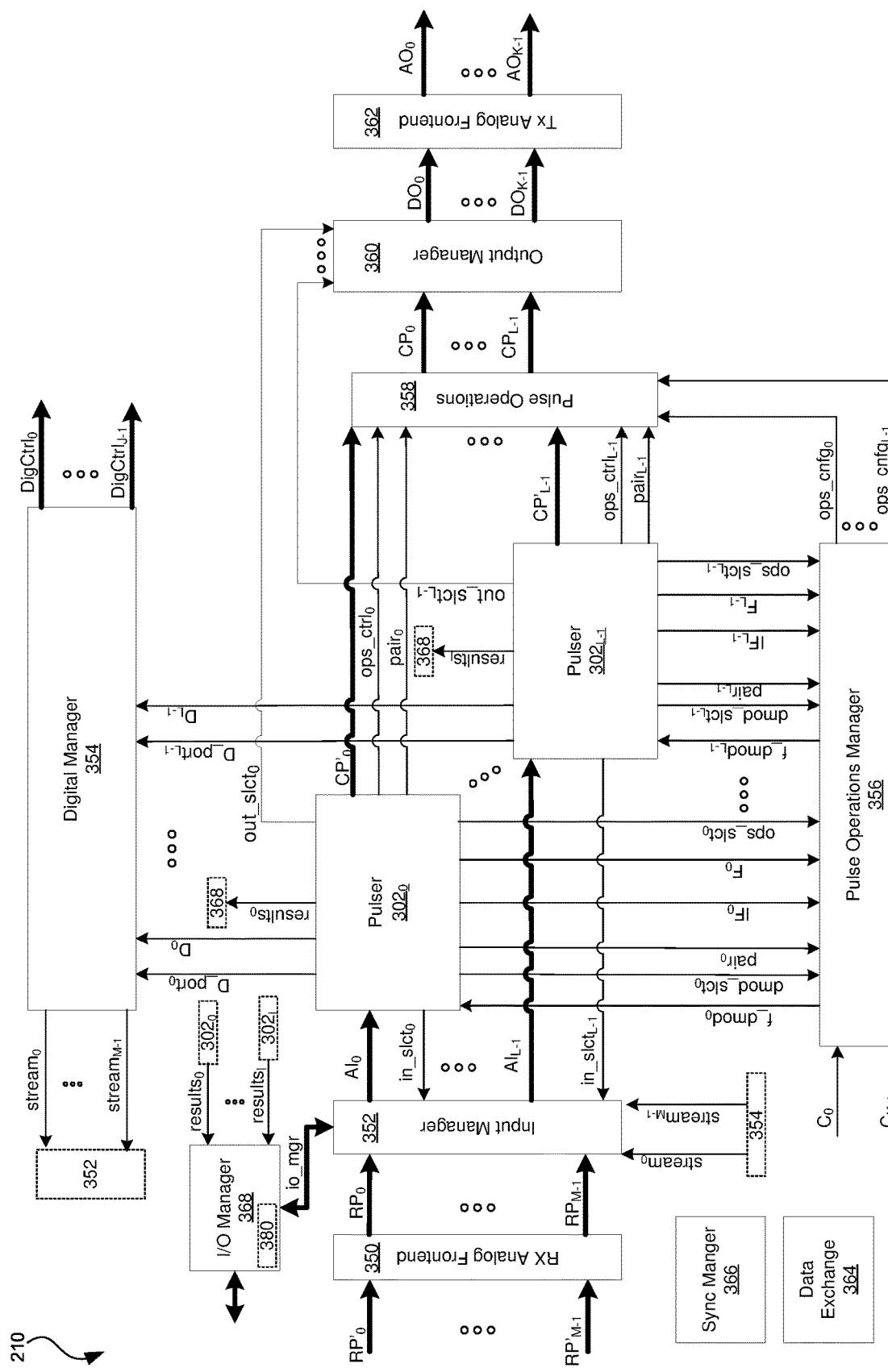
FIG. 3 shows an example implementation of a quantum controller.

FIG. 3 shows an example implementation of the quantum controller 210. The example quantum controller shown comprises pullers $302_1$-$302_{L-1}$ (L an integer ≥1), receive analog frontend 350, input manager 352, digital manager 354, pulse operations manager 356, pulse operations 358, output manager 360, transmit analog frontend 362, data exchange 364, synchronization manager 366, and input/output ("I/O") manager 368.

The receive analog frontend 350 comprises circuitry operable to concurrently process up to M (an integer ≥1) analog inbound signals ($RP'_0$-$RP'_{M-1}$) from one or more outputs of front end circuitry 220 to generate up to M concurrent inbound signals ($RP_0$-$RP_{M-1}$) to be output to input manager 352 via one or more signal paths. Although there is shown to be M signals RP and M signals RP', this need not be the case. Such processing may comprise, for example, analog-to-digital conversion, filtering, upconversion, downconversion, amplification, attenuation, time division multiplexing/demultiplexing, frequency division multiplexing/demultiplexing, and/or the like. In various implementations, M may be less than, equal to, or greater than L and M may be less than, equal to, or greater than K.

The input manager 352 comprises circuitry operable to route any one or more of signals ($RP_0$-$RP_{M-1}$) to any one or more of pulsers $302_0$-$302_{L-1}$ (as signal(s) $Al_0$-$Al_{L-1}$) and/or to other circuits (e.g. as signal io_mgr to I/O manager 368). In an example implementation, the input manager 352 comprises one or more switch networks, multiplexers, and/or the like for dynamically reconfiguring which signals $RP_0$-$RP_{M-1}$ are routed to which pulsers $302_0$-$302_{L-1}$. This may enable time division multiplexing multiple of the signals $RP_0$-$RP_{M-1}$ onto a single signal $Al_l$ and/or time division demultiplexing components (e.g., time slices) of a signal $RP_m$ onto multiple of the signals $Al_0$-$Al_{L-1}$. In an example implementation, the input manager 352 comprises one or more mixers and/or filters for frequency division multiplexing multiple of the signals $RP_0$-$RP_{M-1}$ onto a single signal $Al_l$ and/or frequency division demultiplexing components (e.g., frequency bands) of a signal $RP_m$ onto multiple of the signals $Al_0$-$Al_{L-1}$. The signal routing and multiplexing/demultiplexing functions performed by the input manager 352 enables: a particular pulser $302_l$ to process different inbound pulses from different quantum elements at different times; a particular pulser $302_l$ to process different inbound pulses from different quantum elements at the same time; and multiple of the pulsers $302_0$-$302_{L-1}$ to processes the same inbound pulse at the same time. In the example implementation shown, routing of the signals $RP_0$-$RP_{M-1}$ among the inputs of the pulsers $302_0$-$302_{L-1}$ is controlled by digital control signals in_$slct_0$-in_$slct_{L-1}$ from the pulsers $302_0$-$302_{L-1}$. In another implementation, the input manager may be operable to autonomously determine the appropriate routing (e.g., where the pulse generation program and quantum machine specification 206 includes instructions to be loaded into memory of, and executed by, the input manager 352). In the example implementation, the input manager 352 is operable to route input signals $RP_0$-$RP_{M-1}$ to the I/O manager 368 (as signal(s) io_mgr), to be sent to the quantum programming subsystem 202. This routing may, for example, be controlled by signals from the digital manager 354. In an example implementation, for each input signal $RP_m$ there is a digital signal, stream$_m$, from the digital manager 354 to the input manager 352 that controls whether $RP_m$ will be sent from the input manager 352 to the I/O manager 368 and from there to the quantum programing subsystem 202.

Each pulser circuit $302_l$ (l between 0 and L−1) comprises circuitry operable to generate outbound pulses according to quantum control operations to be performed on the quantum processor 218. This involves very precisely controlling characteristics such as phase, frequency, amplitude, and timing of the outbound pulses. The outbound pulses may be, for example, control pulses sent to the quantum processor 218 to manipulate one or more properties of one or more quantum elements—e.g., manipulate a state of one or more qubits, manipulate a frequency of a qubit using flux biasing, etc., and/or readout a state of one or more quantum elements. The characteristics of an outbound pulse generated at any particular time may be determined, at least in part, on inbound pulses received from the quantum processor 218 via frontend circuitry 220 at a prior time. In an example implementation, the time required to close the feedback loop (i.e., time from receiving a first pulse on an output 217 of front-end circuitry 254 to sending a second pulse (e.g., at an input 221 of front-end circuitry 254), where the second pulse is based on the first pulse, is significantly less than the coherence time of the qubits of the quantum processor 218. For example, the time to close the feedback loop may be on the order of 100 nanoseconds.

In the example implementation shown, each pulser $302_l$ is operable to generate raw outbound pulses $CP'_l$ ("raw" is used simply to denote that the pulse has not yet been processed by pulse operations circuitry 358) and digital control signals in_$slct_l$, D_$port_l$, $D_l$, out_$slct_l$, ops_$ctrl_l$, ops_$slct_l$, $IF_l$, $F_l$, and dmod_$slct_l$ for carrying out quantum algorithms on the quantum processor 218, and results' for carrying intermediate and/or final results generated by the pulser $302_l$ to the quantum programming subsystem 202. One or more of the pulsers $302_0$-$302_{L-1}$ may receive and/or generate additional signals which are not shown in FIG. 3 for clarity of illustration. Each of the pulsers $302_l$ is operable to receive inbound pulse signal $Al_l$ and signal f_$dmod_l$. Pulser $302_l$ may process the inbound signal $Al_l$ to determine the state of certain quantum element(s) in the quantum processor 218 and use this state information for making decisions such as, for example, which raw outbound pulse $CP'_l$ to generate next, when to generate it, and what control signals to generate to affect the characteristics of that raw outbound pulse appropriately. Pulser $302_l$ may use the signal f_$dmod_l$ for determining how to process inbound pulse signal $Al_l$. As an example, when pulser $302_1$ needs to process an inbound signal $Al_1$ from quantum element $122_3$, it can send a dmod_$slct_1$ signal that directs pulse operations manager 356 to send, on f_$dmod_1$, settings to be used for demodulation of an inbound signal $Al_1$ from quantum element $122_3$ (e.g., the pulse operations manager 356 may send the value cos ($\omega_3 * TS * T_{clk1} + \phi_3$), where $\omega_3$ is the frequency of quantum element $122_3$, TS is amount of time passed since the reference point, for instance the time at which a pulse program started running, and $\phi_3$ is the phase of the total frame rotation of quantum element $122_3$, i.e. the accumulated phase of all frame rotations since the reference point).

The pulse operations circuitry 358 is operable to process the raw outbound pulses $CP'_0$-$CP'_{L-1}$ to generate corresponding output outbound pulses $CP_0$-$CP_{L-1}$. This may comprise, for example, manipulating the amplitude, phase, and/or frequency of the raw pulse $CP'_l$. The pulse operations circuitry 358 receives raw outbound pulses $CP'_0$-$CP'_{L-1}$ from pulsers $302_0$-$302_{L-1}$, control signals ops_cnfg$_0$-ops_cnfg$_{L-1}$ from pulse operations manager 356, and ops_ctrl$_0$-ops_ctrl$_{L-1}$ from pulsers $302_0$-$302_{L-1}$.

The control signal ops_cnfg$_l$ configures, at least in part, the pulse operations circuitry 358 such that each raw outbound pulse $CP'_l$ that passes through the pulse operations circuitry 358 has performed on it one or more operation(s) tailored for that particular pulse. To illustrate, denoting a raw outbound pulse from pulser $302_3$ at time T1 as $CP'_{3,T1}$, then, at time T1 (or sometime before T1 to allow for latency, circuit setup, etc.), the digital control signal ops_cnfg$_3$ (denoted ops_cnfg$_{3,T1}$ for purposes of this example) provides the information (e.g., in the form of one or more matrix, as described below) as to what specific operations are to be performed on pulse $CP'_{3,T1}$. Similarly, ops_cnfg$_{4,T1}$ provides the information as to what specific operations are to be performed on pulse $CP'_{4,T1}$, and ops_cnfg$_{3,T2}$ provides the information as to what specific operations are to be performed on pulse $CP'_{3,T2}$.

The control signal ops_ctrl$_l$ provides another way for the pulser $302_l$ to configure how any particular pulse is processed in the pulse operations circuitry 358. This may enable the pulser $302_l$ to, for example, provide information to the pulse operation circuitry 358 that does not need to pass through the pulse operation manager 356. For example, the pulser $302_l$ may send matrix values calculated in real-time by the pulser $302_l$ to be used by the pulse operation circuitry 358 to modify pulse $CP'_l$. These matrix values arrive to the pulse operation circuitry 358 directly from the pulser $302_l$ and do not need to be sent to the pulse operation manager first. Another example may be that the pulser $302_l$ provides information to the pulse operation circuitry 358 to affect the operations themselves (e.g. the signal ops_ctrl$_l$ can choose among several different mathematical operations that can be performed on the pulse).

The pulse operations manager 356 comprises circuitry operable to configure the pulse operations circuitry 358 such that the pulse operations applied to each raw outbound pulse $CP'_l$ are tailored to that particular raw outbound pulse. To illustrate, denoting a first raw outbound pulse to be output during a first time interval T1 as $CP'_{l,T1}$, and a second raw outbound pulse to be output during a second time interval T2 as $CP'_{l,T2}$, then pulse operations circuitry 358 is operable to perform a first one or more operations on $CP'_{l,T1}$ and a second one or more operations on $CP'_{l,T2}$. The first one or more operations may be determined, at least in part, based on to which quantum element the pulse $CP_{l,T1}$ is to be sent, and the second one or more operations may be determined, at least in part, based on to which quantum element the pulse $CP_{l,T2}$ is to be sent. The determination of the first one or more operations and second one or more operations may be performed dynamically during runtime.

The transmit analog frontend 362 comprises circuitry operable to concurrently process up to K digital signals $DO_k$ to generate up to K concurrent analog signals $AO_k$ to be output to inputs 221 of the front-end circuitry 254. Such processing may comprise, for example, digital-to-analog conversion, filtering, upconversion, downconversion, amplification, attenuation, time division multiplexing/demultiplexing, frequency division multiplexing/demultiplexing and/or the like. Although there is one-to-one correspondence between the number of DO signals and the number of AO signals in the example implementation described here, such does not need to be the case. In another example implementation, the analog frontend 362 is operable to map more (or fewer) signals DO to fewer (or more) signals AO. In an example implementation the transmit analog frontend 362 is operable to process digital signals $DO_0$-$DO_{K-1}$ as K independent outbound pulses, as K/2 two-pulse pairs, or process some of signals $DO_0$-$DO_{K-1}$ as independent outbound pulses and some signals $DO_0$-$DO_{K-1}$ as two-pulse pairs (at different times and/or concurrently).

The output manager 360 comprises circuitry operable to route any one or more of signals $CP_0$-$CP_{L-1}$ to any one or more input ports 221 of the front-end circuitry 254. In an example implementation, the output manager 360 comprises one or more switch networks, multiplexers, and/or the like for dynamically reconfiguring which one or more signals $CP_0$-$CP_{L-1}$ are routed to which input port(s) 221 of the front-end 220. This may enable time division multiplexing multiple of the signals $CP_0$-$CP_{L-1}$ onto a single input port 221 of the front-end circuit 220 and/or time division demultiplexing components (e.g., time slices) of a signal $CP_m$ onto multiple of the input ports 221 of the front-end circuitry 254. In an example implementation, the output manager 360 comprises one or more mixers and/or filters for frequency division multiplexing multiple of the signals $CP_0$-$CP_{M-1}$ onto a single input port 221 of front-end circuitry 254 and/or frequency division demultiplexing components (e.g., frequency bands) of a signal $CP_m$ onto multiple of the input ports 221 of the front-end circuitry 254. The signal routing and multiplexing/demultiplexing functions performed by the output manager 360 enables: routing outbound pulses from a particular pulser $302_l$ to different ones input ports 221 at different times; routing outbound pulses from a particular pulser $302_l$ to multiple of the input ports 221 at the same time; and multiple of the pulsers $302_0$-$302_{L-1}$ generating pulses for the same input port 221 at the same time. In the example implementation shown, routing of the signals $CP_0$-$CP_{L-1}$ among the input ports 221 is controlled by digital control signals out_slct$_0$-out_slct$_{L-1}$ from the pulsers $302_0$-$302_{L-1}$. In another implementation, the output manager 360 may be operable to autonomously determine the appropriate routing (e.g., where the pulse generation program and quantum machine specification 206 includes instructions to be loaded into memory of, and executed by, the output manager 360). In an example implementation, at any given time, the output manager 360 is operable to concurrently route K of the digital signals $CP_0$-$CP_{L-1}$ as K independent outbound pulses, concurrently route K/2 of the digital signals $CP_0$-$CP_{L-1}$ as two-pulse pairs, or route some of signals $CP_0$-$CP_{L-1}$ as independent outbound pulses and some others of the signals $CP_0$-$CP_{L-1}$ as multi-pulse sets (at different times and/or concurrently).

The digital manager 354 comprises circuitry operable to process and/or route digital control signals (DigCtrl$_0$-DigCtrl$_{L-1}$) to various circuits of the quantum controller 210 and/or external circuits coupled to the quantum controller 210. In the example implementation shown, the digital manager receives, from each pulser $302_l$, a digital signal $D_l$ that is to be processed and routed by the digital manager 354, and a control signal D_port$_l$ that indicates to which output port(s) of the digital manager 354 the signal $D_l$ should be routed. The digital control signals may be routed to, for example: any one or more of circuits shown in FIG. 3; switches/gates which connect and disconnect the outputs $AO_0$-$AO_{K-1}$ from the front-end circuitry 254 and/or connect and disconnect output ports 225 of the front-end circuitry 254 from the quantum processor 218; and/or any other circuitry which can benefit from real-time information from the pulser circuits $302_0$-$302_{L-1}$. Each such destination of the digital signals may require different operations to be performed on the digital signal (such as delay, broadening, or digital convolution with a given digital pattern). These operations may be performed by the digital manager 354 and may be specified by control signals from the pulsers $302_0$-$302_{L-1}$. This allows each pulser $302_l$ to generate digital signals to different destinations and allows different ones of pulsers $302_0$-$302_{L-1}$ to generate digital signals to the same destination while saving resources.

The synchronization manager 366 comprises circuitry operable to manage synchronization of the various circuits shown in FIG. 3. Such synchronization is advantageous in a modular and dynamic system, such as quantum controller 210, where different ones of pulsers $302_0$-$302_{L-1}$ generate, receive, and process pulses to and from different quantum elements at different times. For example, a pulse generation program may require that a first pulser circuit $302_1$ and a second pulser circuit $302_2$ sometimes need to transmit pulses at precisely the same time, and at other times transmit pulses independently of one another. In the example implementation shown, the synchronization manager 366 reduces the overhead involved in performing such synchronization.

The data exchange circuitry 364 is operable to manage exchange of data among the various circuits shown in FIG. 3. For example, a pulse generation program may require a first pulser circuit $302_1$ and a second pulser circuit $302_2$ to sometimes exchange information. As just one example, pulser $302_1$ may need to share, with pulser $302_2$, the characteristics of an inbound signal $AI_1$ that it just processed so that pulser $302_2$ can generate a raw outbound pulse $CP'_2$ based on the characteristics of $AI_1$. The data exchange circuitry 364 may enable such information exchange. In an example implementation, the data exchange circuitry 364 may comprise one or more registers to and from which the pulsers $302_0$-$302_{L-1}$ can read and write.

The I/O manager 368 is operable to route information between the quantum controller 210 and the quantum programming subsystem 202. Machine code quantum pulse program descriptions may be received via the I/O manager 368. Accordingly, the I/O manager 368 may comprise circuitry for loading the machine code into the necessary registers/memory (including any SRAM, DRAM, FPGA BRAM, flash memory, programmable read only memory, etc.) of the quantum controller 210 as well as for reading contents of the registers/memory of the quantum controller 210 and conveying the contents to the quantum programming subsystem 202. The I/O manager 368 may, for example, include a PCIe controller, AXI controller/interconnect, and/or the like. In an example implementation, the I/O manager 368 comprises one or more registers 380 which can be written to and read from via a quantum machine API and via reserved variables in the language used to create pulse generation program and quantum machine specification 206.

Figure 4:
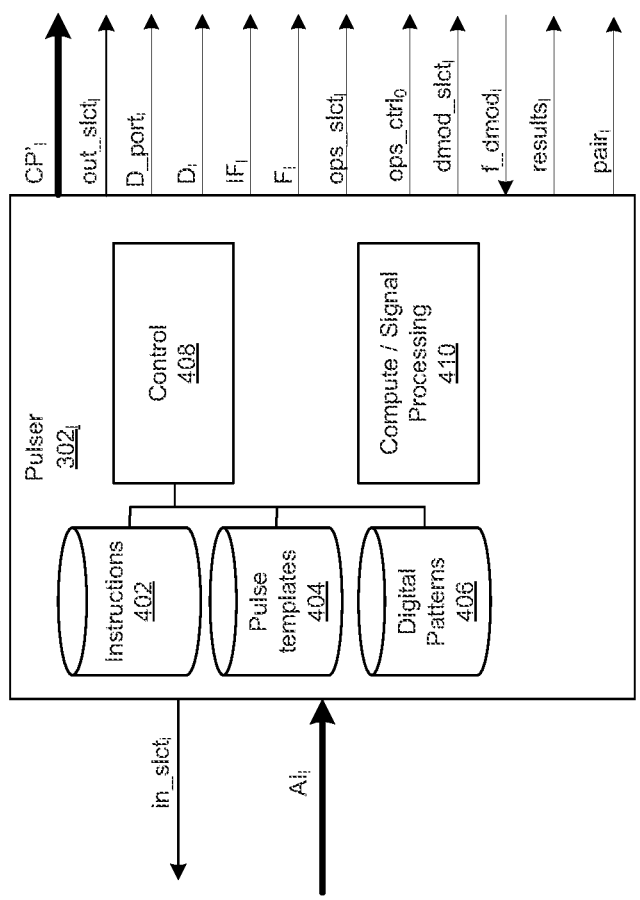
FIG. 4 shows an example implementation of the puller of FIG. 3.

FIG. 4 shows an example implementation of the pulser of FIG. 3. The example pulser $302_l$ shown comprises instruction memory 402, pulse template memory 404, digital pattern memory 406, control circuitry 408, and compute and/or signal processing circuitry (CSP) 410.

The memories 402, 404, 406 may comprise one or more be any type of suitable storage elements (e.g., DRAM, SRAM, Flash, etc.). The instructions stored in memory 402 are instructions to be executed out by the pulser $302_l$ for carrying out a pulse generation program. Because different pulsers $302_0$-$302_{L-1}$ have different roles to play in any particular pulse generation program (e.g., generating different pulses at different times), the instructions memory 402 for each pulser $302_l$ may be specific to that pulser. For example, the pulse generation program from the quantum programming subsystem 202 may comprise a first set of instructions to be loaded (via I/O manager 368) into pulser $302_0$, a second set of instructions to be loaded into pulser $302_1$, and so on. Each pulse template stored in memory 404 comprises a sequence of one or more samples of any arbitrary shape (e.g., Gaussian, sinc, impulse, etc.) representing the pulses to be sent to pulse operation circuitry 358. Each digital pattern stored in memory 406 comprises a sequence of one or more binary values which may represent the digital pulses to be sent to the digital manager 354 for generating digital control signals $DigCtrl_0$-$DigCtrl_{J-1}$.

The control circuitry 408 is operable to execute the instructions stored in memory 402 to process inbound signal $AI_l$, generate raw outbound pulses $CP'_l$, and generate digital control signals in_slct$_l$, out_slct$_l$, D_port$_l$, $D_l$, $IF_l$, $F_l$, ops_slct$_l$, ops_ctrl$_l$, results$_l$, dmod_slct$_l$ and pair$_l$. In the example implementation shown, the processing of the inbound signal $AI_l$ is performed by the CSP circuitry 410 and based (at least in part) on the signal f_dmod$_l$.

The compute and/or signal processing circuitry (CSP) 410 is operable to perform computational and/or signal processing functions, which may comprise, for example Boolean-algebra based logic and arithmetic functions and demodulation (e.g., of inbound signals $AI_l$). The CSP 410 may comprise memory in which are stored instructions for performing the functions and demodulation. The instructions may be specific to a particular pulse generation program and be generated during compilation of the program.

In operation of an example implementation, generation of a raw outbound pulse $CP'_l$ comprises the control circuitry 408: (1) determining a pulse template to retrieve from memory 404 (e.g., based on a result of computations and/or signal processing performed by the CSP 410); (2) retrieving the pulse template; (3) performing some preliminary processing on the pulse template; (4) determining the values of F, IF, pain$_l$, ops_slct$_l$, and dmod_slct$_l$ to be sent to the pulse operation manager 356 (as predetermined in pulse generation program and quantum machine specification 206 and/or determined dynamically based on results of computations and/or signal processing performed by the CSP 410); (5) determining the value of ops_ctrl$_l$ to be sent to the pulse operation circuitry 358; (6) determining the value of in_slct$_l$ to be sent to the input manager 352; (7) determining a digital pattern to retrieve from memory 406 (as predetermined in the pulse generation program and quantum machine specification 206 and/or determined dynamically based on results of computations and/or signal processing performed by the CSP 410); (8) outputting the digital pattern as $D_l$ to the digital manager along with control signal D_port$_l$ (as predetermined in the pulse program description and/or determined dynamically based on results of computations and/or signal processing performed by the CSP 410); (9) outputting the raw outbound pulse $CP'_l$ to the pulse operations circuitry 358; (10) outputting results$_l$ to the I/O manager.

Figure 5:
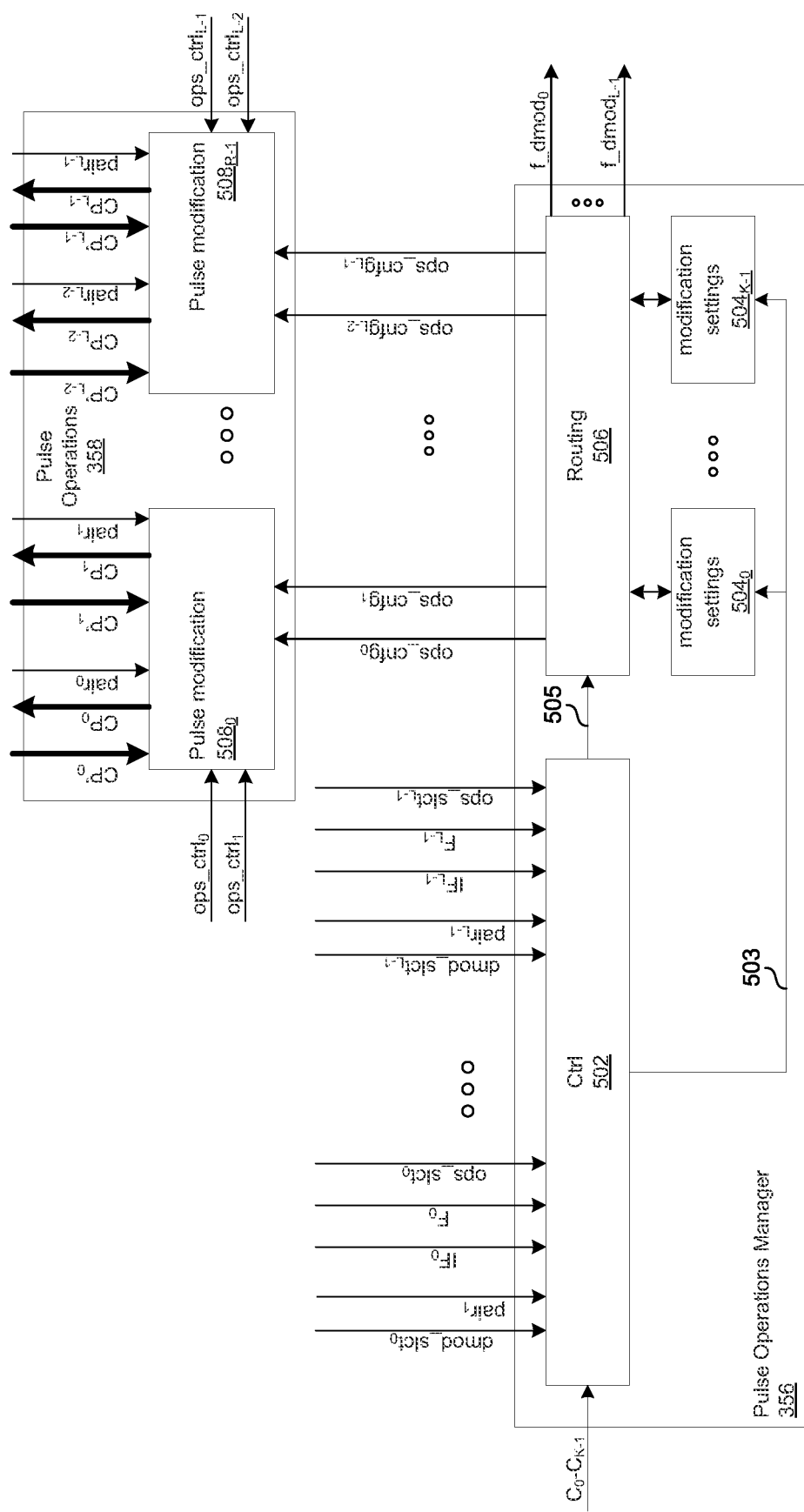
FIG. 5 shows an example implementation of pulse operations manager and pulse operations circuitry.

FIG. 5 shows an example implementation of the pulse operations manager and pulse operations circuitry of FIG. 3. The pulse operations circuitry 358 comprises a plurality of pulse modification circuits $508_0$-$508_{R-1}$ (R is an integer ≥1 in general, and R=L/2 in the example shown). The pulse operations manager 356 comprises control circuitry 502, routing circuitry 506, and a plurality of modification settings circuits $504_0$-$504_{K-1}$.

Although the example implementation has a 1-to-2 correspondence between pulse modification circuits $508_0$-$508_{R-1}$ and pulser circuits $302_0$-$302_{L-1}$, such does not need to be the case. In other implementations there may be fewer pulse modification circuits 508 than pulser circuits 302. Similarly, other implementations may comprise more pulse modification circuits 508 than pulser circuits 302.

As an example, in some instances, two of the pullers $302_0$-$302_{L-1}$ may generate two raw outbound pulses which are a phase-quadrature pulse pair. For example, assuming $CP_1$ and $CP_2$ are a phase-quadrature pulse pair to be output. In this example, pulse operations circuitry 358 may process $CP_1$ and $CP_2$ by multiplying a vector representation of $CP'_1$ and $CP'_2$ by one or more 2 by 2 matrices to: (1) perform single-sideband-modulation, as given by $(CP_1\ CP_2)=(\cos(\omega*TS*T_{clck1})-\sin(\omega*TS*T_{clck1})\sin(\omega*TS*T_{clck1})\ \cos(\omega*TS*T_{clck1}))(CP'_1\ CP'_2)$, where ω is the frequency of the single sideband modulation and TS is the time passed since the reference time (e.g. the beginning of a certain control protocol); (2) keep track of frame-of-reference rotations, as given by $(CP_1\ CP_2)=(\cos(\phi)-\sin(\phi)\ \sin(\phi)\ \cos(\phi))(CP'_1\ CP'_2)$, where $\phi$ is the total phase that the frame of reference accumulated since the reference time; and/or (3) perform an IQ-mixer correction $(CP_1\ CP_2)=(C_{00}\ C_{01}\ C_{10}\ C_{11})(CP'_1\ CP'_2)$, where $C_{00}$, $C_{01}$, $C_{10}$, and $C_{11}$ are the elements of a matrix that corrects for IQ-mixer imperfections. In an example implementation, each modification settings circuit, $504_k$, contains registers that contain the matrix elements of three matrices: $C_k=(C_{k00}\ C_{k01}\ C_{k10}\ C_{k11})$, an IQ-mixer correction matrix; $S_k=(\cos(\omega_k*TS*T_{clck1})-\sin(\omega_k*TS)*T_{clck1}\ \sin(\omega_k*TS*T_{clck1})\ \cos(\omega_k*TS*T_{clck1}))$, a single sideband frequency modulation matrix; and $F_k=(\cos(\phi_k)-\sin(\phi_k)\ \sin(\phi_k)\ \cos(\phi_k))$, a frame rotation matrix, which rotates the IQ axes around the axis perpendicular to the IQ plane (i.e. the z-axis if I and Q are the x-axis and y-axis). In an example implementation, each modification settings circuit $504_k$ also contains registers that contain the elements of the matrix products $C_k S_k F_k$ and $S_k F_k$.

In the example shown, each pulse modification circuit $508_r$ is operable to process two raw outbound pulses $CP'_{2r}$ and $CP'_{2r+1}$ according to: the modification settings $ops\_cnfg_{2r}$ and $ops\_cnfg_{2r+1}$; the signals $ops\_ctrl_{2r}$ and $ops\_ctrl_{2r+1}$; and the signals $pair_{2r}$ and $pair_{2r+1}$. In an example implementation $pair_{2r}$ and $pair_{2r+1}$ may be communicated as $ops\_ctrl_{2r}$ and $ops\_ctrl_{2r+1}$. The result of the processing is outbound pulses $CP_{2r}$ and $CP_{2r+1}$. Such processing may comprise adjusting a phase, frequency, and/or amplitude of the raw outbound pulses $CP'_{2r}$ and $CP'_{2r+1}$. In an example implementation, $ops\_cnfg_{2r}$ and $ops\_cnfg_{2r+1}$ are in the form of a matrix comprising real and/or complex numbers and the processing comprises matrix multiplication involving a matrix representation of the raw outbound pulses $CP_{2r}$ and $CP_{2r+1}$ and the $ops\_cnfg_{2r}$ and $ops\_cnfg_{2r+1}$ matrix.

The control circuitry 502 is operable to exchange information with the puller circuits $302_0$-$302_{L-1}$ to generate values of $ops\_confg_0$-$ops\_confg_{L-1}$ and $f\_demod_0$-$f\_demod_{L-1}$, to control routing circuitry 506 based on signals $ops\_slct_0$-$ops\_slct_{L-1}$ and $dmod\_slct_0$-$dmod\_slct_{L-1}$, and to update pulse modification settings $504_0$-$504_{K-1}$ based on $IF_0$-$IF_{L-1}$ and $F_0$-$F_{L-1}$ such that pulse modification settings output to pulse operations circuitry 358 are specifically tailored to each raw outbound pulse (e.g., to which quantum element 226 or 228 the pulse is destined, to which input port 221 of front-end circuitry 254 the pulse is destined, etc.) to be processed by pulse operations circuitry 358.

Each modification settings circuit $504_k$ comprises circuitry operable to store modification settings for later retrieval and communication to the pulse operations circuitry 358. The modification settings stored in each modification settings circuit $504_k$ may be in the form of one or more two-dimensional complex-valued matrices. Each path a pulse may travel to the quantum processor 218 via front-end circuitry 254 may have particular characteristics (e.g., non-idealities of interconnect, mixers, switches, attenuators, amplifiers, and/or circuits along the paths) to be accounted for by the pulse modification operations. Similarly, each quantum element $122_0$-$122_k$ may have a particular characteristics (e.g. resonance frequency, frame of reference, etc.). In an example implementation, the number of pulse modification settings, K, stored in the circuits 504 corresponds to the number of signal paths, such that each of the modification settings circuits $504_0$-$504_{K-1}$ stores modification settings for a respective one of the paths. In other implementations, there may be more or fewer pulse modification circuits 504 than signal paths and more or fewer pulse modification circuits 504 than quantum elements 122 and more or fewer signal paths than quantum elements 122. The control circuitry 502 may load values into the modification settings circuit $504_0$-$504_{K-1}$ via signal 503.

The routing circuitry 506 is operable to route modification settings from the modification settings circuits $504_0$-$504_{L-1}$ to the pulse operations circuit 358 (as $ops\_confg_0$-$ops\_confg_{L-1}$) and to the pulsers $302_0$-$302_{L-1}$ (as $f\_dmod_0$-$f\_dmod_{L-1}$). In the example implementation shown, which of the modification settings circuits $504_0$-$504_{K-1}$ has its/their contents sent to which of the pulse modification circuits $508_0$-$508_{R-1}$ and to which of the pulsers $302_0$-$302_{L-1}$ is controlled by the signal 505 from the control circuitry 502.

The signal $ops\_slct_l$ informs the pulse operations manager 356 as to which modification settings $504_k$ to send to the pulse modification circuit $508_l$. The pulser $302_l$ may determine $ops\_slct_l$ based on the particular quantum element $122_k$ and/or signal path to which the pulse is to be transmitted (e.g., the resonant frequency of the quantum element, frame of reference, and/or mixer correction). The determination of which quantum element and/or signal path to which a particular pulser $302_l$ is to send an outbound pulse at a particular time may be predetermined in the pulse generation program and quantum machine specification 206 or may be determined based on calculations performed by the pulser $302_l$ and/or others of the pulsers $302_0$-$302_{L-1}$ during runtime. The control circuitry 502 may then use this information to configure the routing block 506 such that the correct modification settings are routed to the correct one or more of the pulse modification circuits $508_0$-$508_{L-1}$.

In an example implementation, the digital signal $IF_l$ instructs the pulse operations manager 356 to update a frequency setting of the modification settings circuit $504_k$ indicated by $ops\_slct_l$. In an example implementation, the frequency setting is the matrix $S_k$ (described above) and the signal $IF_l$ carries new values indicating the new $\omega_k$ to be used in the elements of the matrix $S_k$. The new values may, for example, be determined during a calibration routine (e.g., performed as an initial portion of the pulse generation program) in which one or more of the pulsers $302_0$-$302_{L-1}$ sends a series of outbound pulses CP, each at a different carrier frequency, and then measures the corresponding inbound signals AI.

In an example implementation, the signal $F_l$ instructs the pulse operations manager 356 to update a frame setting of the modification settings circuit $504_k$ indicated by ops_slct$_l$. In an example implementation, the frame setting is the matrix $F_k$ (described above) and the signal $F_l$ carries a rotation matrix Fi which multiplies with $F_k$ to rotate $F_k$. This can be written as $F_k=F_lF_k=(\cos(\Delta\phi)-\sin(\Delta\phi) \sin(\Delta\phi) \cos(\Delta\phi))(\cos(\phi_k)-\sin(\phi_k) \sin(\phi_k) \cos(\phi_k))=(\cos(\phi_k+\Delta\phi)-\sin(\phi_k+\Delta\phi)\sin(\phi_k+\Delta\phi)\cos(\phi_k+\Delta\phi))$, where $\phi_k$ is the frame of reference before the rotation and $\Delta\phi$ is the amount by which to rotate the frame of reference. The pulser $302_l$ may determine $\Delta\phi$ based on a predetermined algorithm or based on calculations performed by the pulsers $302_l$ and/or others of the pulsers $302_0$-$302_{L-1}$ during runtime.

In an example implementation, the signal dmod_sclt$_l$ informs the pulse operations manager 356 from which of the modification settings circuits $504_k$ to retrieve values to be sent to pulser $302_l$ as f_dmod$_l$. The pulser $302_l$ may determine dmod_sclt$_l$ based on the particular quantum element $122_k$ and/or signal path from which the pulse to be processed arrived. The determination of from which quantum element and/or signal path a particular pulser $302_l$ is to process an inbound pulse at a particular time may be predetermined in the pulse generation program and quantum machine specification 206 or may be determined based on calculations performed by the pulser $302_l$ and/or others of the pulsers $302_0$-$302_{L-1}$ during runtime. The control circuitry 502 may then use this information to configure the routing block 506 such that the correct modification settings are routed to the correct one of the pulsers $302_0$-$302_{L-1}$. For example, when pulse generation circuit $302_l$ needs to demodulate a pulse signal AI$_l$ from quantum element $122_k$, it will send a dmod_sclt$_l$ signal instructing the pulse operation manager 356 to rout the element $SF_{k00}=\cos(\omega_k*\text{time\_stamp}+\phi_k)$ from modification settings circuit $504_k$ to puller $302_l$ (as f_dmod$_l$).

In the example implementation shown, the digital signals $C_0$-$C_{K-1}$ provide information about signal-path-specific modification settings to be used for each of the signal paths to the quantum processor 218. For example, each signal $C_k$ may comprise a matrix to be multiplied by a matrix representation of a raw outbound pulse CP'$_l$ such that the resulting output outbound pulse is pre-compensated for errors (e.g., resulting from imperfections in mixers, amplifiers, wiring, etc.) introduced as the outbound pulse propagates along the signal path. The result of the pre-compensation is that output outbound pulse CP$_l$ will have the proper characteristics upon arriving at the quantum processor 218. The signals $C_0$-$C_{K-1}$ may, for example, be calculated by the quantum controller 210 itself, by the programming subsystem 202, and/or by external calibration equipment and provided via I/O manager 368. The calculation of signals may be done as part of a calibration routine which may be performed before execution of a pulse generation program and/or may be determined/adapted in real-time as part of a pulse generation program (e.g., to compensate for temperature changes during runtime of the pulse generation program).

Figures 6A, 6B:
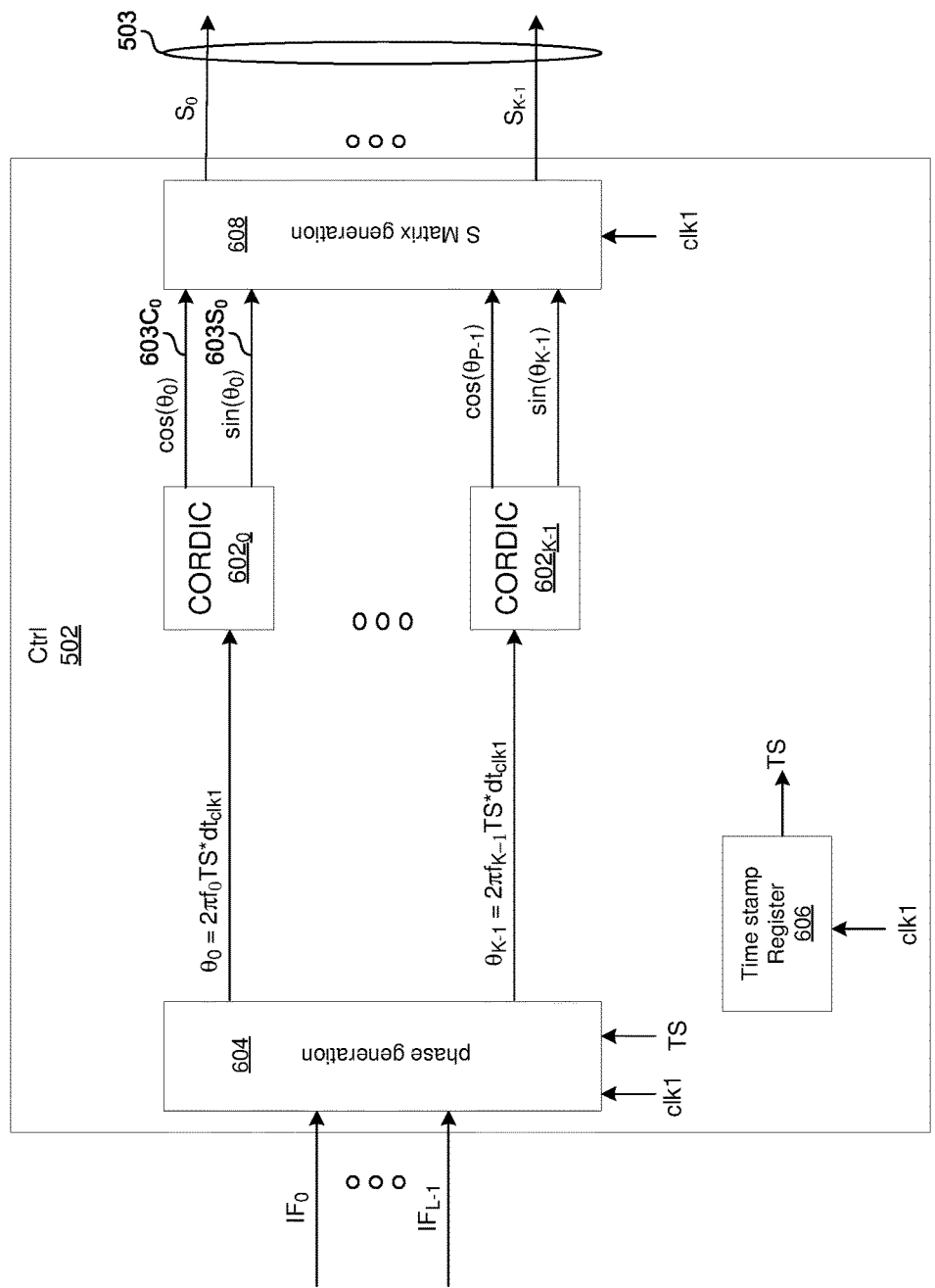
FIGS. 6A-6B shows frequency generation circuitry of the quantum controller of FIG. 3.

FIG. 6A shows frequency generation circuitry of the quantum controller of FIG. 3. In the example implementation shown, the frequency generation circuitry is part of control circuitry 502 of pulse operations manager circuitry 356. The frequency generation circuitry comprises K coordinate rotation digital computer (CORDIC) circuits $602_0$-$604_{K-1}$, phase generation circuitry 604, timestamp register 606, and S-Matrix generation circuitry 608.

Each CORDIC circuit $602_k$ is operable to compute cosine and sine of its input, $\theta_k$, thus generating two signals $\cos(\theta_k)$ and $\sin(\theta_k)$.

The phase generation circuitry 604 is operable to generate the CORDIC input parameters $\theta_0$-$\theta_{k-1}$ based on: (1) the frequency setting signals $IF_0$-$IF_{L-1}$ from the pullers $302_0$-$302_{L-1}$; and (2) the contents, TS, of the timestamp register 606.

The timestamp register 606 comprises circuitry (e.g., a counter incremented on each cycle of the clock signal clk1) operable to track the number of cycles of clk1 since a reference point in time (e.g., power up of the quantum controller 210, start of execution of set of instructions of a pulse generation program by the quantum controller 210, etc.).

In the example shown, the phase generation circuitry 604 sets $\theta_0=2\pi f_0(TS)(dt_{clk1})$, where $f_0$ is a frequency determined from the signal $IF_0$, TS is the number of clock cycles counted from the reference point and $dt_{clk1}$ is the duration of a single clock cycle of clk1. This leads to the CORDIC outputs being a pair of phase-quadrature reference signals, $\cos(2\pi f_0(TS)(dt_{clk1}))$ and $\sin(2\pi f_0(TS)(dt_{clk1}))$, as in the example shown, which are used to generate the $S_0$ rotation matrix that rotates at a frequency $f_0$.

As shown in FIG. 6B, the signal IF$_l$ may comprise an update component and an $f_l$ component. In an example implementation, when update$_l$ is asserted then the phase generation circuitry updates one of more of $f_0$-$f_{K-1}$ to be the value of $f_l$.

The S-matrix generation circuitry 608 is operable to build the matrices $S_0$-$S_{K-1}$ from the outputs of the CORDIC circuits $602_0$-$602_{K-1}$. In an example implementation, the S-matrix generation circuit 608 is operable to synchronize changes to the S matrices such that any matrix update occurs on a desired cycle of clock clk1 (which may be determined by the control information $IF_0$-$IF_{L-1}$).

With K CORDIC circuits $602_k$, the frequency generation circuitry is operable to concurrently generate K S-matrices. In instances that more than K frequencies are needed over the course of a set of instructions, the phase generation circuit 604 is operable to change the input parameter $\theta_k$ of one or more of the CORDIC circuits $602_0$-$602_{K-1}$ to stop generating one frequency and start generating the K+1$^{th}$ frequency. In some instances, it may be necessary for the new frequency to start at a phase $\theta$ that would have been the phase if the new frequency was being generated from the initial reference time (e.g., because the new frequency would be used to address a quantum element that has a resonance at the new frequency and that was coherent since the reference point). In some other instances, it might be necessary to start the new frequency from the phase that the old frequency ended in. The phase generation circuit 604 and timestamp register 606 enable both of these possibilities.

Figure 7:
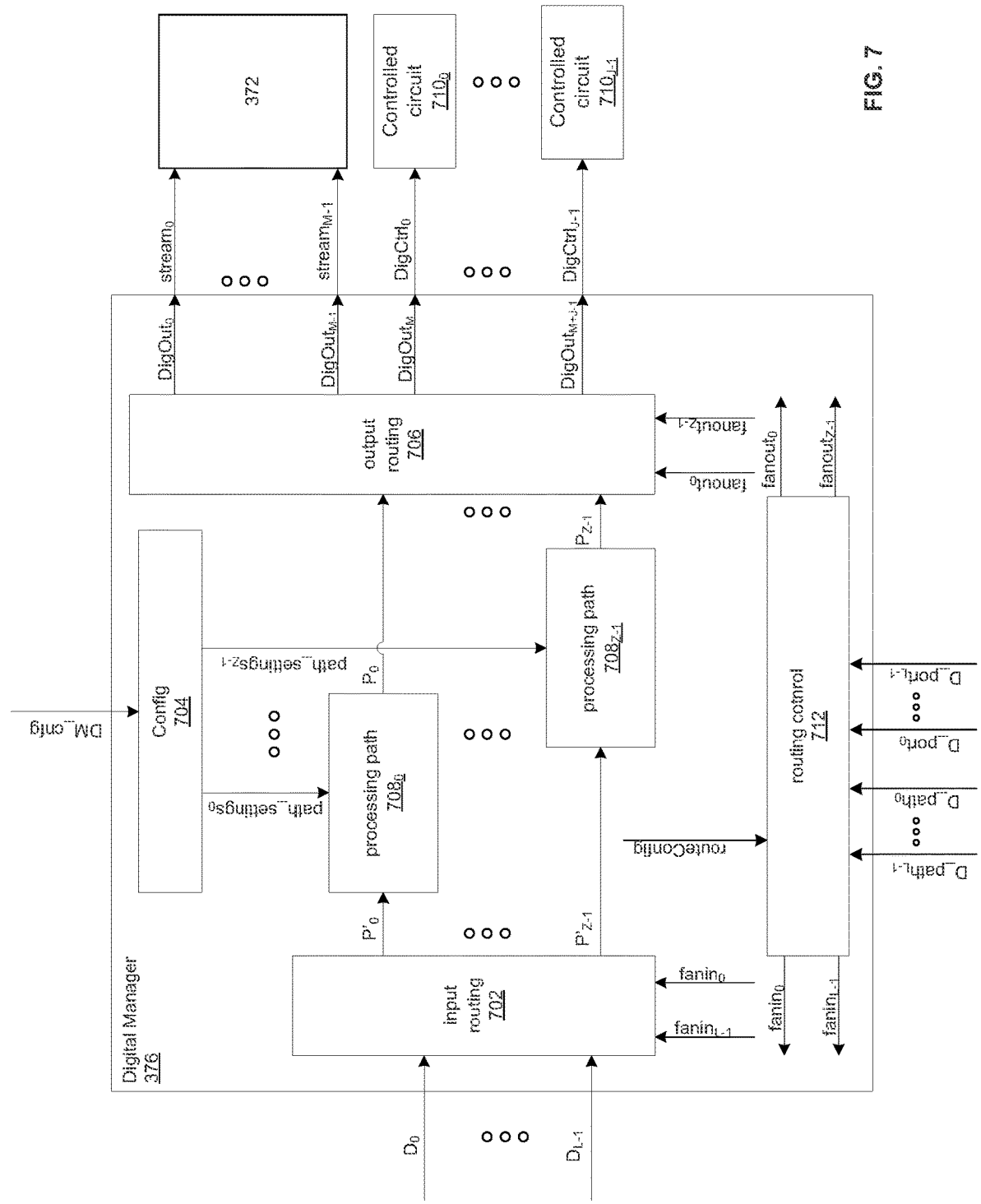
FIGS. 7-8 show example implementations of digital manager circuitry.

FIG. 7 shows an example implementation of the digital manager of FIG. 3. Shown in FIG. 7 are the digital manager 376, controlled circuits $710_0$-$710_{J-1}$, and input manager 372.

The example implementation of the digital manager 376 comprises input routing circuit 702, configuration circuit 704, output routing circuit 706, processing paths $708_0$-$708_{Z-1}$ (where Z is an integer), and routing control circuit 712.

The configuration circuit 704 is operable to store configuration settings and use those settings to configure the processing paths $708_0$-$708_{Z-1}$ and/or the routing control circuit 712. The settings may, for example, be loaded via the signal DM_config as part of the pulse generation program and quantum machine specification 206 provided by quantum programming subsystem 202. The settings may comprise, for example, one or more of: a bitmap on which may be based a determination of which of signals $D_0$-$D_{L-1}$ to route to which of signals $P'_0$-$P'_{Z-1}$ for one or more instructions of a pulse program; a bitmap on which may be based a determination of which processing path outputs $P_0$-$P_{Z-1}$ to route to which of $DigOut_0$-$DigOut_{J+M-1}$ for one or more instructions of a pulse program; and one or more bit patterns which processing paths $708_0$-$708_{Z-1}$ may convolve with one or more of the signals $P'_0$-$P'_{Z-1}$ for one or more instructions of a pulse program.

The input routing circuit 702 is operable to route each of the digital signals $D_0$-$D_{L-1}$ to one or more of the processing paths $708_0$-$708_{Z-1}$. At any given time (e.g., for any particular instruction of every puller $302_l$ of pullers $302_0$-$302_L$), the input routing circuit 702 may determine to which of the processing paths $708_0$-$708_{Z-1}$ to rout the signal $D_l$ of signals $D_0$-$D_{L-1}$ based on the signal $fanin_l$ of signals $fanin_0$-$fanin_{L-1}$. That is, for a particular instruction, the digital signal $D_l$ may be routed to any one or more of paths $708_0$-$708_{Z-1}$ based on the value of $fanin_l$ for that instruction. For example, $fanin_l$ may be a Z-bit signal and a state of each bit of $fanin_l$ during a particular instruction may indicate whether $D_l$ is to be routed to a corresponding one of the Z processing paths $708_0$-$708_{Z-1}$ during that instruction. An example implementation of the input routing circuit 702 is described below with reference to FIG. 8.

The output routing circuit 706 is operable to route each of the digital signals $P_0$-$P_{Z-1}$ to one or more of $DigOut_0$-$DigOut_{J+M-1}$ (In the example shown $DigOut_0$-$DigOut_{J+M-1}$ connect to $stream_0$-$stream_{M-1}$, respectively, and $DigOut_M$-$DigOut_{J+M-1}$ connect to $DigCtrl_0$-$DigCtrl_{J-1}$, respectively). At any given time (e.g., for any particular instruction of every puller $302_l$ of pulsers $302_0$-$302_L$), the output routing circuit 706 may determine to which of $DigOut_0$-$DigOut_{J+M-1}$ to rout the signal Pi of the signals $P_0$-$P_{L-1}$ based on the signal $fanout_l$ of signals $fanout_0$-$fanout_{Z-1}$. That is, for a particular instruction, the digital signal $P_z$ (z an integer between 0 and Z) may be routed to any one or more of $DigOut_0$-$DigOut_{J+M-1}$ based on the value of $fanout_z$ for that instruction. For example, values of $fanout_z$ may be (J+M-1) bits and a state of each bit of $fanout_z$ during a particular instruction may indicate whether $P_z$ is to be routed to a corresponding one of the J+M-1 signals DigOut during that instruction. An example implementation of the output routing circuit 706 is described below with reference to FIG. 8.

Each of the processing path circuits $708_0$-$708_{Z-1}$ is operable to manipulate a respective one of signals $P'_0$-$P'_{Z-1}$ to generate a corresponding manipulated signal $P_0$-$P_{Z-1}$. The manipulation may comprise, for example, introducing a delay to the signal such that the resulting one or more of $DigOut_0$-$DigOut_{J+M-1}$ reach(es) its/their destination (a controlled circuit 710 and/or input manager 372) at the proper time with respect to the time of arrival of a corresponding quantum control pulse at the corresponding destination.

Each of the controlled circuits $710_0$-$710_{J-1}$ and input manager 372 is a circuit which, at least some of the time, needs to operate synchronously with quantum control pulses generated by one or more of pulsers $302_0$-$302_{L-1}$ (possibly a reflection/return pulse from a quantum processor in the case of input manager 372). Accordingly, each of the control circuits $710_0$-$710_{J-1}$ receives a respective one of control signals $DigOut_0$-$DigCtrl_{J-1}$ that is synchronized with a respective quantum control pulse. Similarly, input manager 372 receives a plurality of the DigOut signals (one for each stream input).

The routing controller 712 comprises circuitry operable to generate signals $fanin_0$-$fanin_{L-1}$ and $fanout_0$-$fanout_{Z-1}$ based on $D\_path_0$-$D\_path_{L-1}$, $D\_port_0$-$D\_port_{L-1}$, and/or information stored in configuration circuit 704.

Figure 8:
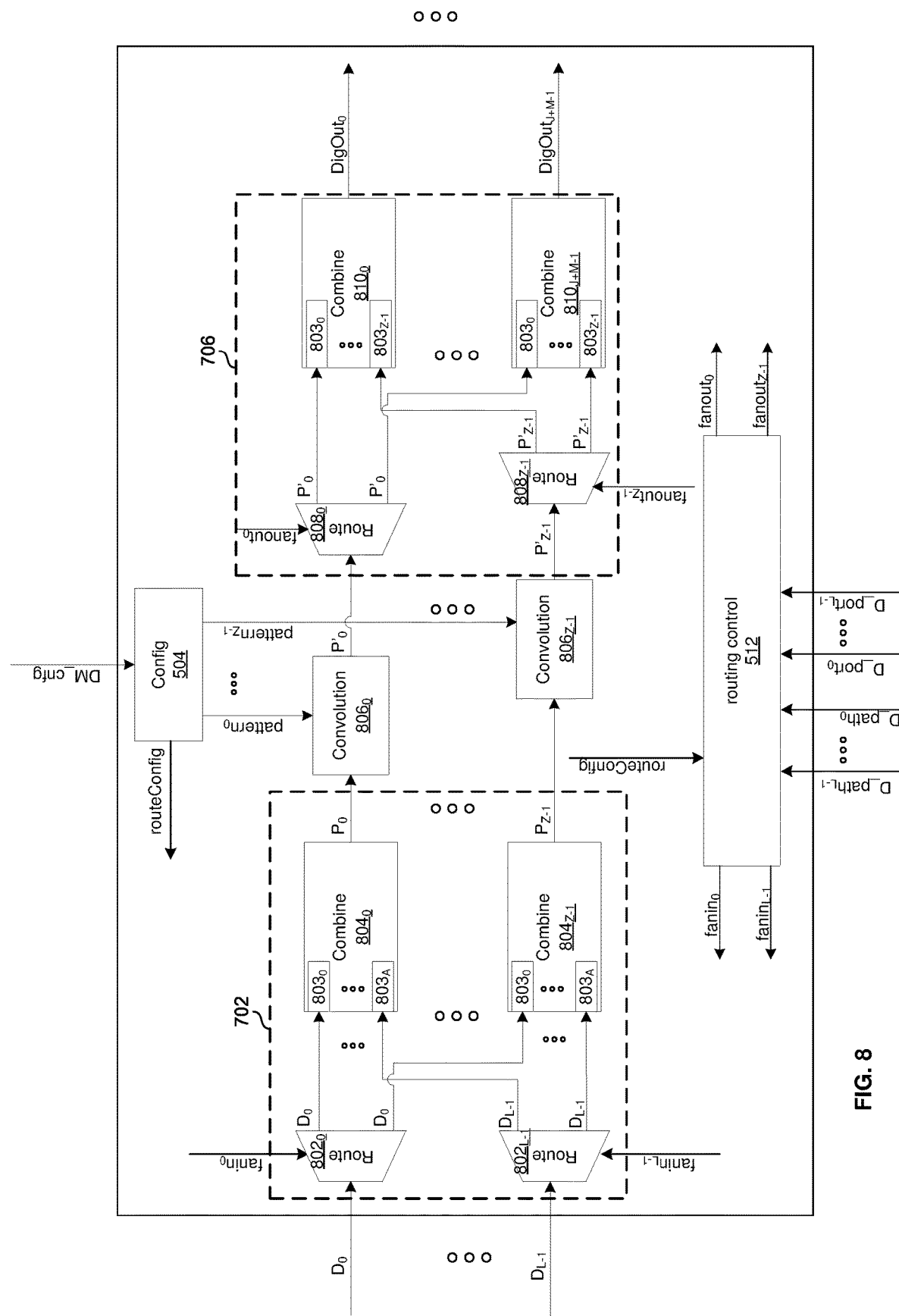

FIG. 8 shows an example implementation of the digital manager of FIG. 3. The example input routing circuit 702 comprises routing circuits $802_0$-$802_{L-1}$ and combining circuits $804_0$-$804_{L-1}$. The example output routing circuitry 506 comprises circuits routing circuits $808_0$-$808_{Z-1}$ and combining circuits $810_0$-$810_{J-1}$. The example processing path circuits are convolution circuits $806_0$-$806_{Z-1}$.

Each of the routing circuits $802_0$-$802_L$ is operable to route a respective one of signals $D_0$-$D_{L-1}$ to one or more of the combining circuits $804_0$-$804_{Z-1}$. To which of combining circuit(s) $804_0$-$804_{Z-1}$ the signal $D_l$ is routed is determined based on the signal $fanin_l$. In an example implementation, each signal $fanin_l$ is a Z-bits signal and, for a $pulser_l$ instruction, the value of bit z of the signal $fanin_l$ determines whether the signal $D_l$ is to be routed to combining circuit $804_z$ for that instruction. The value of $fanin_l$ may be updated on a per-instruction basis.

Each of combining circuits $804_0$-$804_{L-1}$ is operable to combine up to L of the signals D0-DL-1 to generate a corresponding one of signals $P_0$-$P_{Z-1}$. In an example implementation, the combining comprises OR-ing together the values of the up to L signals.

Each of the routing circuits $808_0$-$808_{Z-1}$ is operable to route a respective one of signals $P'_0$-$P'_{Z-1}$ to one or more of the combining circuits $810_0$-$810_{J-1}$. To which of combining circuit(s) $810_0$-$810_{J-1}$ the signal $P'_z$ is routed is determined based on the signal $fanout_z$. In an example implementation, each signal $fanout_z$ is a (J+M-1)-bit signal and the value of bit j+m-1 of the signal $fanout_z$ determines whether the signal $P'_z$ is to be routed to combining circuit $804_{j+m-1}$. In an example implementation the value of $fanout_z$ is preconfigured before the runtime of the pulse program, however, in another implementation it may be updated dynamically (e.g., on a per-instruction basis).

Each combining circuit of combining circuits $810_0$-$810_{J-1}$ is operable to combine up to Z of the signals $P'_0$-$P'_{Z-1}$ (received via inputs $803_0$ to $803_{Z-1}$) to generate a corresponding one of signals $DigOut_0$-$DigOut_{J+M-1}$. In an example implementation, the combining comprises OR-ing together the values of the up to Z signals.

Each convolution circuit $806_z$ is operable to convolve signal $P_z$ with $pattern_z$ to generate signal $P'_z$. In an example implementation, $pattern_z$ is preconfigured before runtime of the pulse program, however, in another implementation it may be updated dynamically. $pattern_z$ may be determined based on: the destination(s) of signal $P_z$ (e.g., to which of controlled circuits 510 and/or input of input manager 352 Pz is intended); characteristics of the corresponding quantum control pulse (e.g., any one or more of its frequency, phase, amplitude, and/or duration); and/or process, temperature, and/or voltage variations.

Figure 9A:
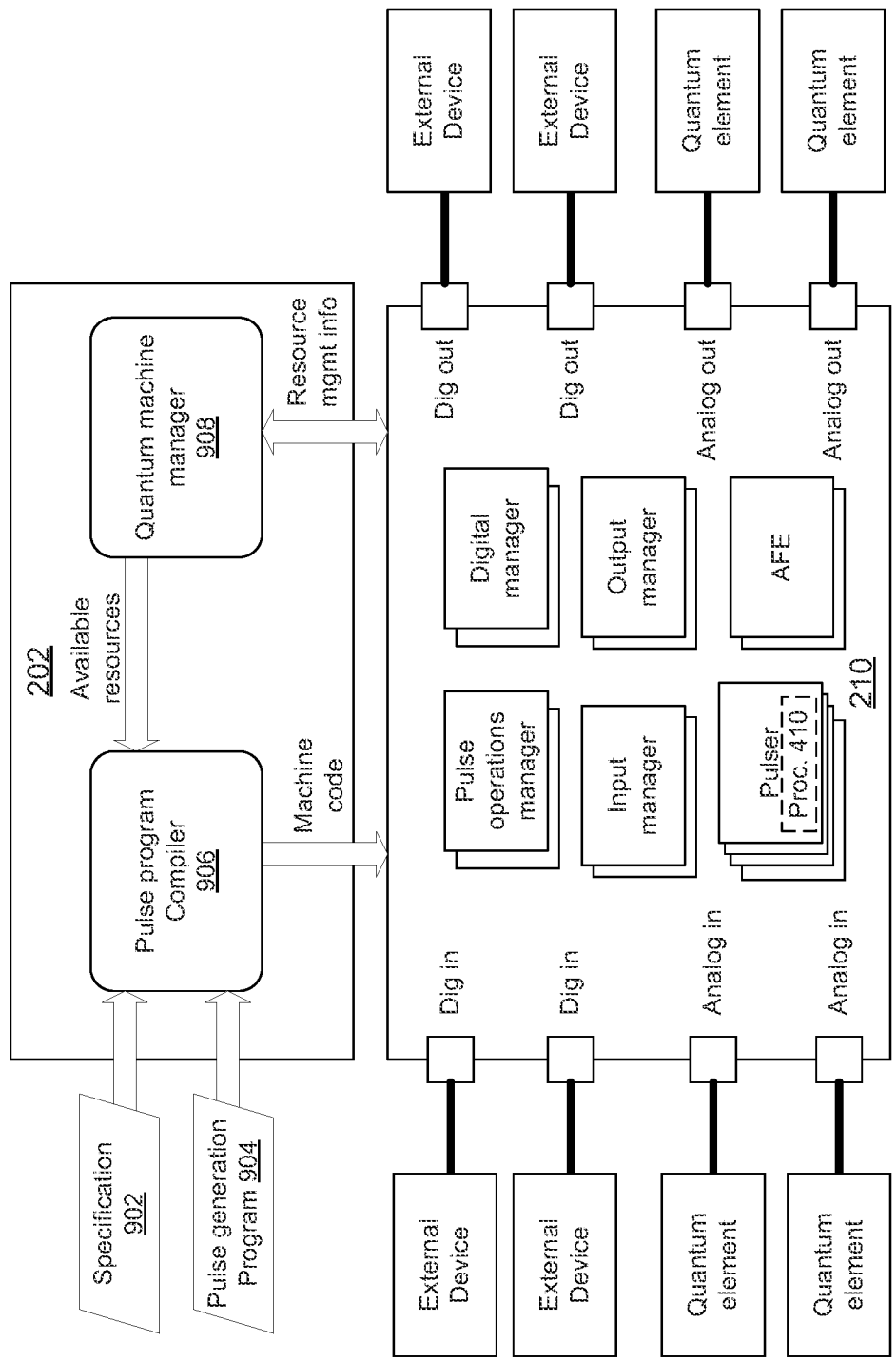
FIG. 9A illustrates configuration and control of the quantum controller via the quantum programming subsystem.

FIG. 9A illustrates configuration and control of the quantum controller via the quantum programming subsystem. In FIG. 9A, the quantum controller 210 comprises one or more instances of various circuits (such as the puller, input manager, output manager, digital manager, pulse operations manager, and analog front end circuits described above). Connected to the inputs and outputs of the quantum controller 210 may be a plurality of external devices (e.g., oscilloscopes, waveform generators, spectrum analyzers, mixers, amplifiers, etc.) and a plurality of quantum elements. As described in further detail below, these physical circuits can be allocated and deallocated independently of one another such that the physical resources of the quantum controller 210, and the quantum elements and external devices connected to the quantum controller 210 via the analog and digital inputs and outputs, can be organized into one or more "quantum machines."

Also shown in FIG. 9A are a compiler 906 and quantum machines manager 908 of the quantum programming subsystem 202.

The compiler 906 comprises circuitry operable to generate quantum controller machine code based on: (1) a specification 902; (2) a pulse generation program 904; and (3) a resources management data structure from the quantum machines manager 908.

Figure 9B:
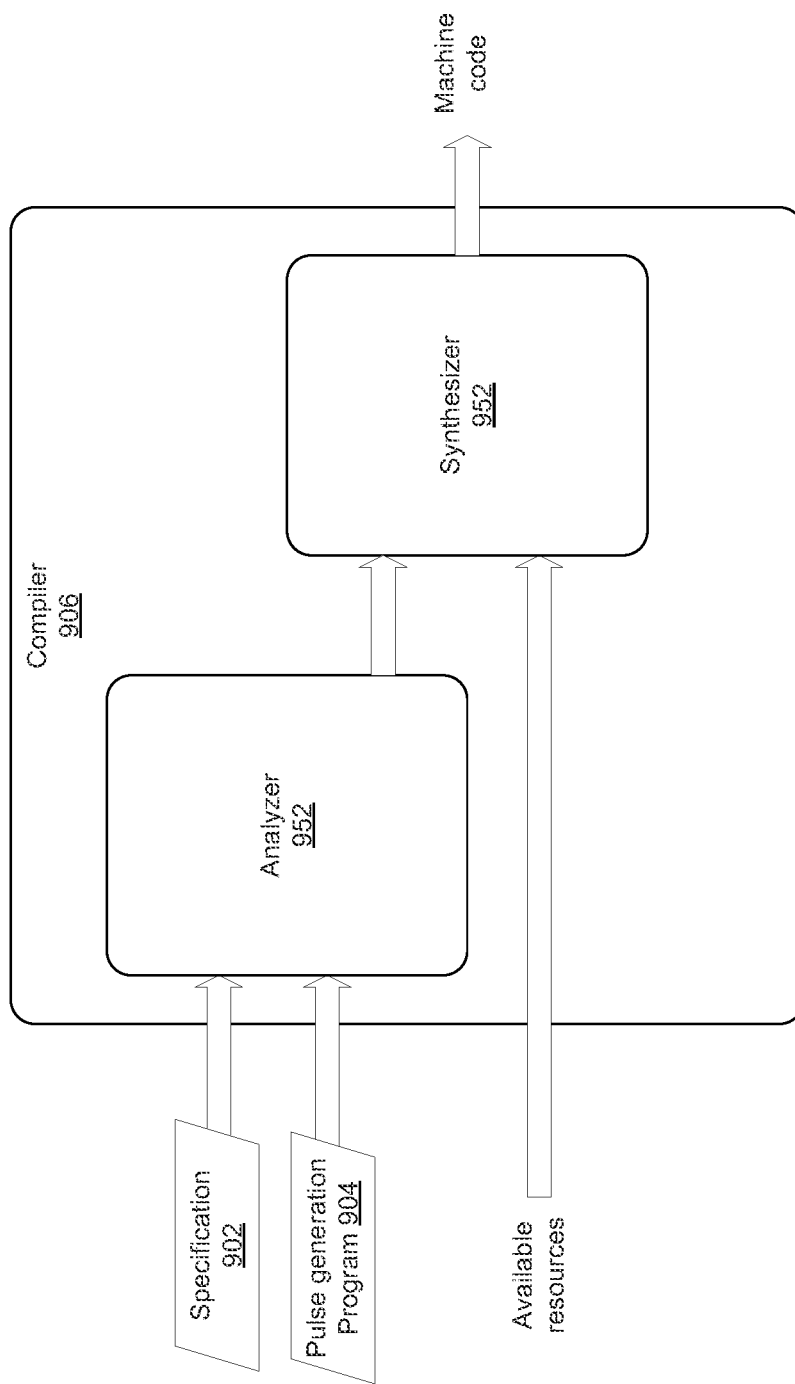
FIG. 9B illustrates an example implementation of the compiler of FIG. 9A.

Referring to FIG. 9B, an example implementation of the compiler 906 comprises analyzer circuitry 952 and synthesizer circuitry 954. The analyzer circuitry 952 is operable to parse the specification 902 and program 904 to generate an intermediate code representation (e.g., a parse tree). The synthesizer circuitry 954 is operable to generate machine code based on the intermediate code representation and the available resources indicated by the quantum machines manager 908.

The specification 902 identifies resources of a quantum machine some of which are mapped to physical circuits during an instantiation of a quantum machines (e.g. input and output ports of the quantum controller 210), and some of which the compiler attaches to physical circuits of the quantum controller 210 during compilation of a Pulse generation Program 904. The compiler 906 may allocate resources for executing the program 904 based on the specification 902, the program 904, and/or the available resources indicated by the quantum machines manager 908. As an example, assume a scenario in which there are five quantum elements in the specification 902 and the program 904 uses only two of the quantum elements; the number of the pulsers $302_0$-$302_L$ allocated may depend on the available resources and the specifics of the program 904. In one case the compiler 906 may allocate a first number (e.g., two) of the pulsers $302_0$-$302_L$ for interfacing with the two quantum elements and in another case the compiler may allocate a second number (e.g., four) for sending pulses to the two quantum elements. In an example implementation, Python is used as a "host" language for the specification and the specification is a Python dictionary. In this example implementation the Python syntax/constructs can thus be leveraged to create the specification (Python variables, functions, etc.).

The pulse generation program 904 comprises statements that define a sequence of operations to be performed by the quantum machine defined in the specification 902. Such operations typically include the generation of one or more analog pulses to be sent to a controlled element, such as a quantum element. Such operations typically include measuring one or more return pulses from an element. The pulse generation program is also referred to herein as a QUA program. Functions, syntax, etc. of the QUA programming language are described below. In an example implementation, Python is used as a "host" language for the QUA program. This allows leveraging Python syntax/constructs (Python variables, functions, etc.) to generate the QUA program, but it is still a QUA—not Python—program to be compiled by the compiler 906 to generate QOP machine code, and to be executed on the quantum controller/s 210.

In an example implementation, a QUA program defines the sequence of statements for: (1) Generating, shaping and sending pulses to the quantum device; (2) Measuring of pulses returning from the quantum device; (3) Performing real-time classical calculations on the measured data and storing results in classical variables; (4) Performing real-time classical calculations on classical variables; (5) Controlling the flow of the program, including branching statements; and (6) Streaming of data from the quantum controller 210 to the quantum programing system 202 and processing and saving it in the quantum programing system 202.

In addition to the specification of which pulses are played, a QUA program can also specify when they should be played through both explicit and implicit statements and dependency constructs. Thus, a QUA program can define exactly the timing in which pulses are played, down to the single sample level and single clock cycles of the quantum controller 210.

Compilation may include allocating specific resources of the quantum controller 210 to that quantum machine and then generating machine code that, when executed by quantum controller 210, will use those allocated resources.

The quantum machines manager 908 comprises circuitry operable to determine resources present in the quantum controller 210 and the availability of those resources at any given time. To determine the resources, the quantum machines manager 908 may be operable to read one or more configuration registers of the quantum controller 210, inspect a netlist of one or more circuits of the quantum controller 210, and/or parse hardware description language (HDL) source code used to define circuits of the quantum controller 210 and/or other files used to describe various configurations of the hardware and software components. Once the resources are determined, the quantum machines manager 908 may keep track of which resources are in use and which are available based on which quantum machines are "open" (i.e., in a state where some resources are reserved for that machine regardless of which, if any, pulse program that quantum machine is executing at that time), and/or which pulse programs are loaded into and/or being executed by the quantum controller 210 at that time.

For each element defined in a specification 902, the controller output and/or input ports to which it is connected are defined. During compilation, pulse modification settings for manipulating pulses intended for an element may be generated (for loading into pulse modification settings circuits 504) and the pulse modification setting circuit(s) 504 to which they will be loaded before execution may be chosen and may be allocated to the quantum machine on which the program is to be executed. Similarly, parameters and configurations of operations that will be performed on input signals related to an element (e.g. readout/measurement pulses) may be generated during compilation (for loading into compute and signal processing circuits 410). Likewise, the compute and signal processing circuit 410 in which they will be used may be chosen during compilation and may be allocated to the quantum machine on which the program is to be executed during compilation.

One example of an element that a quantum machine may contain is a mixer of front-end circuitry 254. To correct for mixer imbalances, the in-phase/quadrature (IQ) waveforms of the pulse can be multiplied by a 2×2 mixer correction matrix before being sent to the output ports. This mixer correction matrix, determined via a calibration routine, may be frequency dependent. Thus, a mixer definition may include the mixer's name and a list of one or more frequencies and the correction matrix to be used at each frequency. In one example implementation, the correction matrix is loaded into corresponding pulse modification circuit during compilation. Similarly, an element definition may include an intermediate frequency with which every pulse sent to the element is to be modulated.

When generating local oscillators for quantum control, it is desirable to minimize phase noise at offset from the carrier frequency that are determined by typical quantum gate(s) times, and typical quantum element coherence times. For example, for one quantum system with shorter gate time it may be desirable to minimize phase noise in the range of 10 MHz to 100 MHz, whereas for another quantum system with longer gate times, it may be desirable to minimize phase noise in the range of 100 Hz to 100 kHz. Also, the tolerable amount of phase noise may depend on the quantum system being controlled and/or the quantum algorithm being performed. Some systems and/or algorithms can tolerate higher phase noise. Laboratories using these systems and/or running these algorithms could benefit from a lower-cost implementation of multi-tone generator 222. Other quantum systems and/or algorithms can benefit from lower phase noise, and for those systems and/or algorithms the added cost of a lower-phase-noise implementation of the multi-tone generator 222 may be justified.

Figure 10:
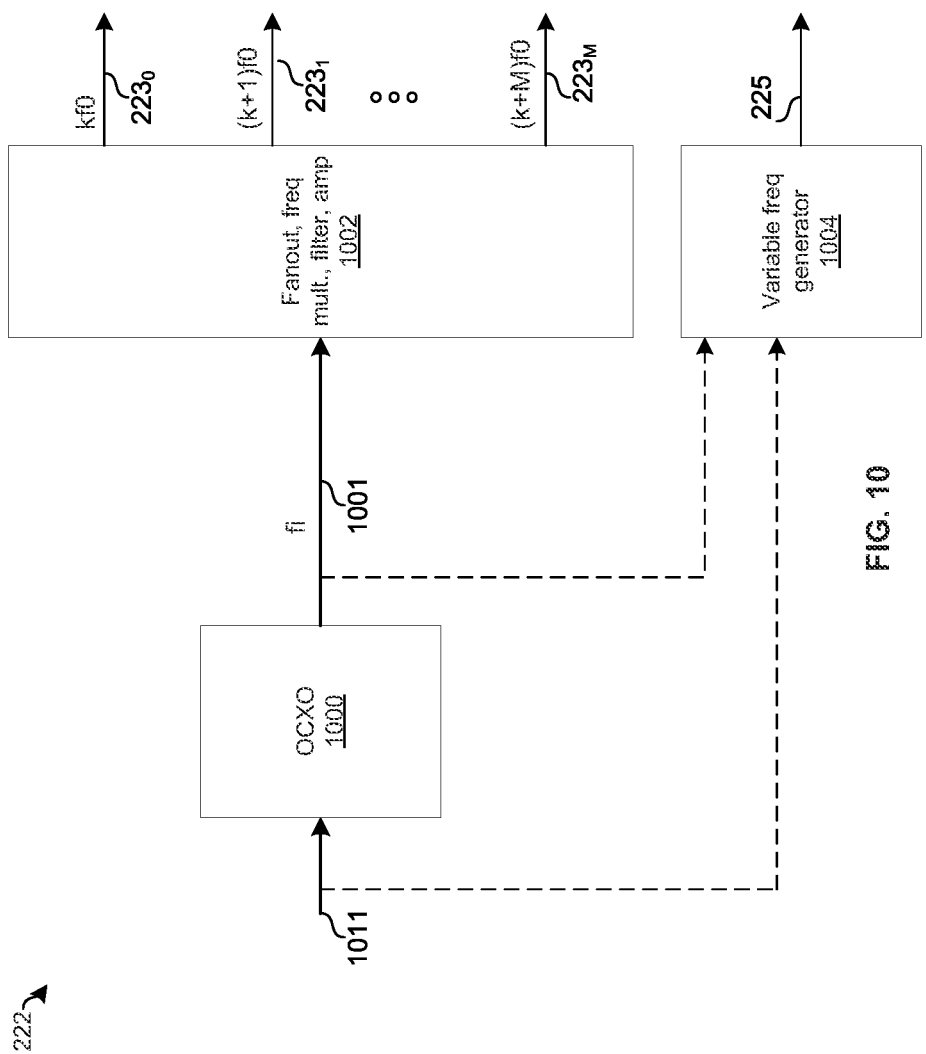
FIG. 10 shows an example implementation of a multi-tone generator.

FIG. 10 shows an example implementation of a quantum control multi-tone generator. Shown is an example implementation of multi-tone generator 222 comprising oven-controlled crystal oscillator (OCXO) and signal processing circuitry 1002. The signal processing circuitry is operable to perform splitting, frequency multiplication, gain adjustment, filtering, and/or other signal processing operations to generate M+1 local oscillator signals 1003 from the OCXO output 1001. The signal 1001 is at frequency fi, f0 is a multiple of fi, each of the signals 223 is at a multiple of f0, and each of k and M are integers. In one example implementation, fi=100 MHz, f0=500 MHz, k=5, M=12, and signals $223_0$-$223_M$ range from 500 MHz to 7 GHz in step of 500 MHz. Other implementations may use any other values of fi, f0, k, and M. Unlike the example implementations of FIGS. 11A and 11B, the implementation of FIG. 10 does not use any dielectric resonators (DROs) or feedback loops. This lowers the cost of the implementation of FIG. 10 relative to the implementations of FIGS. 11A and 11B with the tradeoff that phase noise saturates to a noise floor above a certain carrier offset frequency (e.g., the phase noise may be higher at offsets between ~10 MHz and 100 MHz from the carrier frequency).

The use of multiple fixed-frequency tones, avoids the need for the voltage controlled oscillators and phase locked loops used in the signal generators conventionally used for driving quantum systems, which has the benefit of greatly reducing phase noise in the circuitry 222 (in general VCOs introduce additional phase noise as compared to OCXOs).

In an example implementation, the quantum control multi-tone generator 222 also comprises a variable frequency signal generator 1004 operable to output a signal 231 having a variable (i.e., tunable) frequency. The variable frequency generator 1004 may be driven by the same reference signal that is input to the OCXO 1000 (e.g., a 10 MHz signal) and/or may be driven by the signal 1001 output by OXCO 1000 (e.g., a 1000 MHz signal).

For quantum computing applications, it is not only the individual phase noise fluctuations that affect the gate operation fidelity, but also the correlation between separate reference sources. In the implementations of FIG. 10, the use of a single fundamental frequency, fi, which is then upconverted to the output frequencies using mixers, amplifiers, and bandpass filters provides positive phase correlation between the phase noises of the outputs. This generation of coherent tones through multiplication and filtering of a common reference signal may increase quantum gate fidelity in scenarios where multiple sequential single-gate operations are applied to qubits that are operating using different frequency tones, as well as two-qubit gate operations.

In an example implementation, the signal processing circuit 1002 performs fanout, frequency multiplication, amplification, and filtration functions. In one such implementation, the multiplication is done by injecting the frequency reference fi (1001) into a nonlinear transmission line (NLTL). The NLTL creates, at its output, a comb of frequencies with spacing fi. The output of the NLTL is then fanned out to become signals $223_0$-$223_M$, wherein each individual signal $223_m$ is composed of the sum of multiples of fi. Each fanout output $223_m$ (0<=m<=M) is amplified and filtered with a bandpass filter with a passband which includes the frequency (k+m)*fi (0<=m<=M) and having stopbands which include the tones present at f<=(f+m−1)*fi and f>=(k+m+1)*fi so as to filter all adjacent tones, leaving a monotone output at frequency (k+m)*fi. This is just one example and other type of filtering configurations are possible. For example, in another implementation, the pass bands and stop bands of the filtering stages may be chosen in such a way as to allow multiple tones on the same channel. The fanout frequency multiplication, amplification, and filtration circuit 1002 can be composed of one or more NLTL, amplifier, square wave amplifier, power divider, attenuator, filter, diplexer, bias-T, inductor, resistor, and capacitor.

Figure 11A:
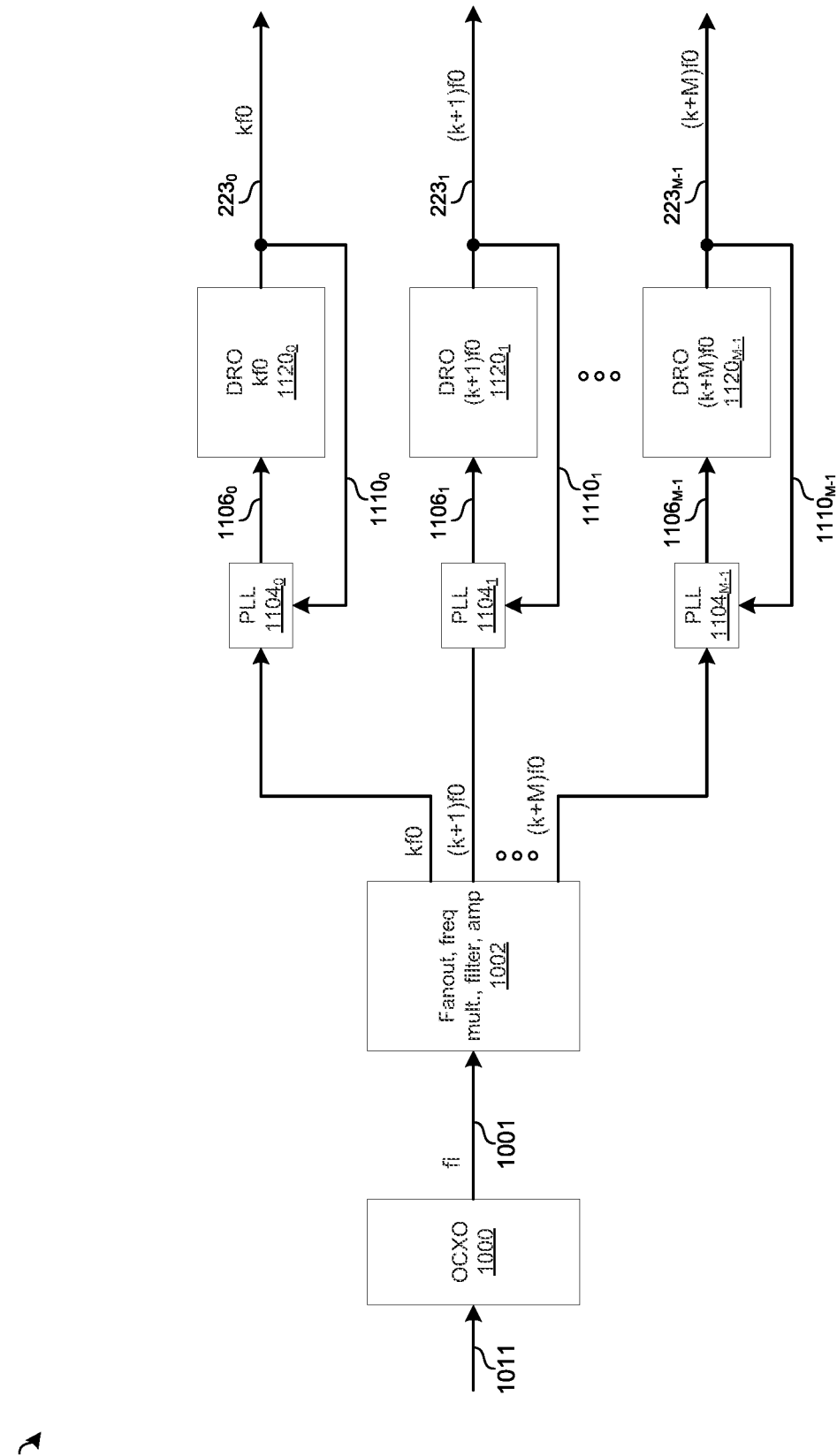
FIG. 11A shows an example implementation of a multi-tone generator.
Figure 12:
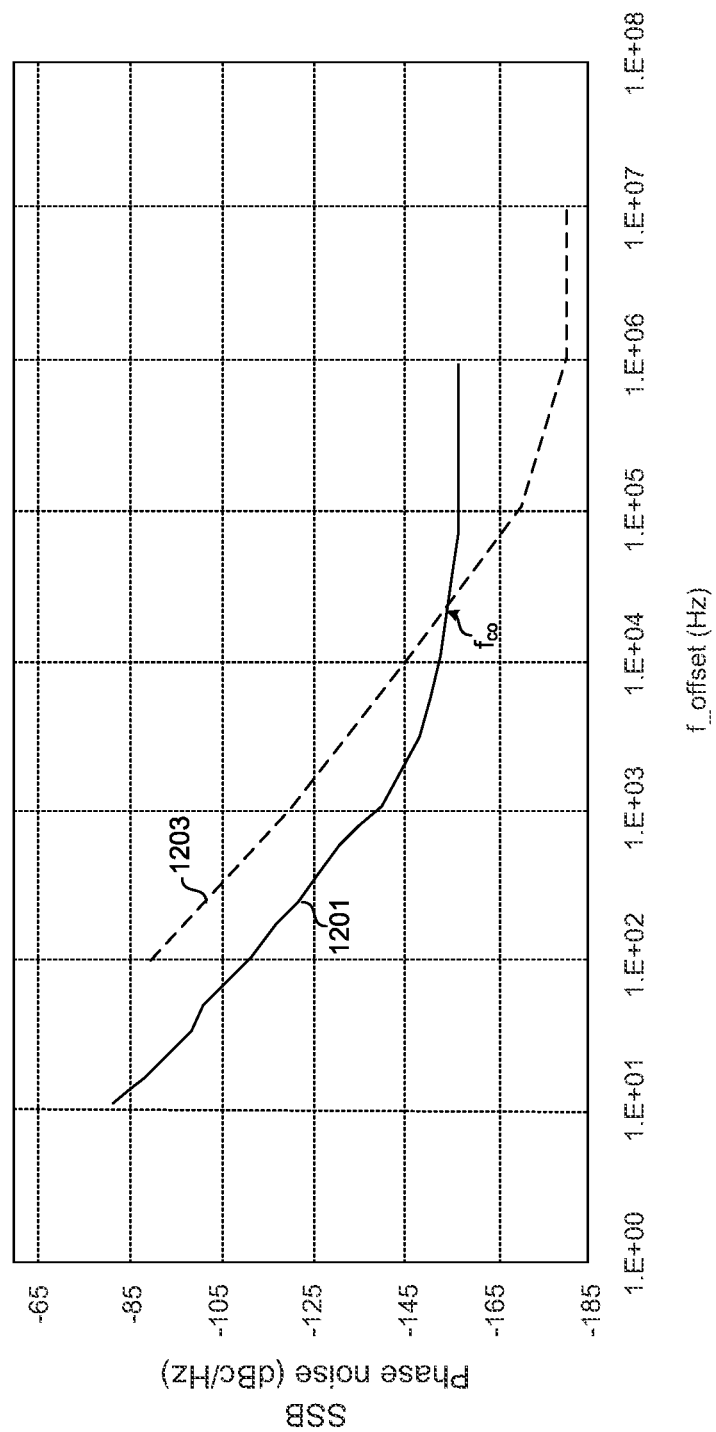
FIG. 12 illustrates phase noise performance of a multi-tone generator.

FIG. 11A shows an example implementation of a quantum control multi-tone generator. Again shown are the OCXO 1000 and the circuit 1002 which outputs M multiples of the fi. Each of the outputs of circuit 1002 is then input to circuitry comprising a PLL and DRO 1120 in a feedback arrangement to generate a signal 223. The DROs have the effect of lowering phase noise in the signals 223 at frequencies far from the carrier frequency. This is illustrated in FIG. 12 for an example signal $223_m$ having carrier frequency of 5 GHz. Specifically, the phase noise of signal $223_m$ (m an integer between 0 and M-1) is the minimum of the line 1201—the phase noise of the circuit 1002, and line 1203—the phase noise of the DRO. The cut-over from the line 1201 to the line 1203 around 5.E+5 is achieved by tuning the PLL bandwidth (e.g., via a variable resistor). The implementation of FIG. 11A provides improved phase noise performance over the implementation of FIG. 10, at the expense of higher component cost (DROs are very expensive).

Figure 11B:
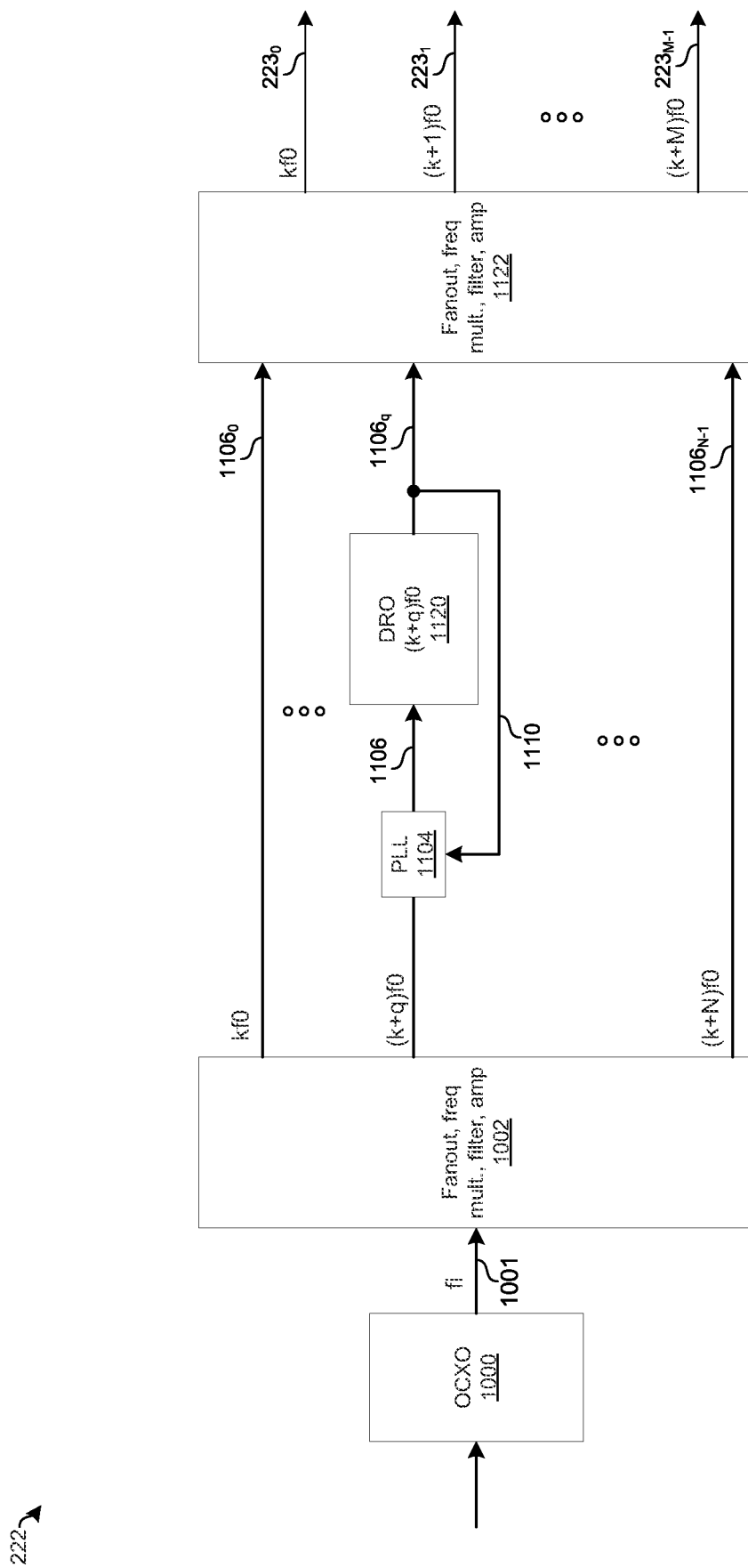
FIG. 11B shows an example implementation of a multi-tone generator.

FIG. 11B shows an example implementation of a quantum control multi-tone generator. In contrast to the implementation of FIG. 11A, the implementation of FIG. 11B uses only a single DRO 1120 and PLL 1104. In FIG. 11B, the outputs of circuit 1002 and the DRO 1120 feed a signal processing circuit 1122 which mixes the signals $1106_0$-$1106_{N-1}$ (N an integer) to generate signals $223_0$-$223_{M-1}$. Which of the N+1 signals $1106_0$-$1106_{N-1}$ is selected as signal $1106q$ (q an integer where 0≤q≤N−1) to be input to the PLL 1104 may be determined (e.g., preconfigured or controlled programmatically during operation via signal(s) 253, 255, 257, and/or 259) based on the desired frequencies of the signals $223_0$-$223_M$.

In an example implementation, fi=100 MHz, f0=500 MHz, k=5, N=4, M=12, q=5, and signals $223_0$-$223_M$ range from 500 MHz to 7 GHz in step of 500 MHz generated as follows:

$1106_0$ and $223_0$ are at 500 MHz,
$1106_1$ and $223_1$ are at 1 GHz,
$1106_2$ and $223_2$ are at 1.5 GHz,
$1106_3$ and $223_3$ are at 2 GHz,
$1106_4$ and $223_4$ are at 2.5 GHz,
$1106_5$ (=$1106q$) and $223_5$ are at 3 GHz $223_6$ at 3.5 GHz is generated by mixing $1106_0$ and $1106_q$ in circuit 1122

$223_7$ at 4 GHz is generated by mixing $1106_1$ and $1106_q$ in circuit 1122

$223_8$ at 4.5 GHz is generated by mixing $1106_2$ and $1106_q$ in circuit 1122

$223_8$ at 5 GHz is generated by mixing $1106_3$ and $1106_q$ in circuit 1122

$223_9$ at 5.5 GHz is generated by mixing $1106_4$ and $1106_q$ in circuit 1122

$223_{10}$ at 6 GHz is generated by doubling $1106_q$ in circuit 1122

$223_{11}$ at 6.5 GHz is generated by mixing $1106_0$ and the doubled $1106_q$ in circuit 1122

$223_{12}$ at 7 GHz is generated by mixing $1106_1$ and the doubled $1106_q$ in circuit 1122.

In an example implementation, the number of signals 223 and/or the frequency spacing of the signals 223 may be determined based on the range of frequencies that the control circuitry 502 of quantum controller 210 is configured to generate. As an example, referring to FIG. 6A, if the control circuit 502 is configured to output signals 503 that span a range of 800 MHz. Then, as long as the spacing between the tones 223 is less than 800 MHz (ignoring margin for simplicity of example), then the quantum orchestration platform is able to generate quantum control signals across the range of frequencies from $F223_0$ minus 800 MHz (Frequency of signal $223_0$ minus 800 MHz) to $F223_M$ plus 800 MHz (Frequency of signal $223_0$ plus 800 MHz). This, combined with programmatic control (via signal(s) 253, 255, 257, and/or 259) of the which of the tones $223_0$-$223_M$ is routed to which mixer of circuit 254 enables, for example, programmatically sweeping over a 1 GHz+ range of frequencies sent to a particular quantum element.

Figure 11C:
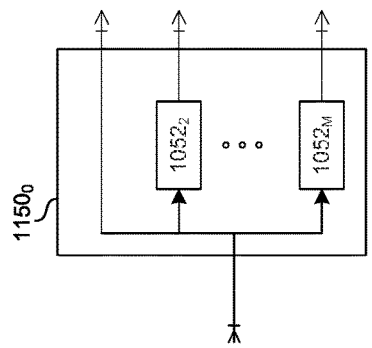
FIG. 11C shows example implementation details of circuitry of the multi-tone generator.
Figure 11C:
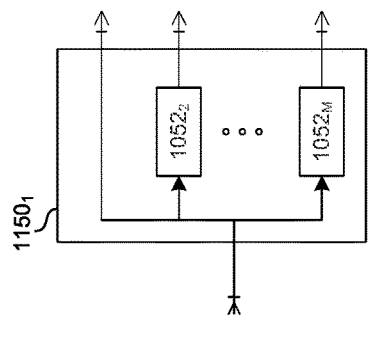
Figure 11C:
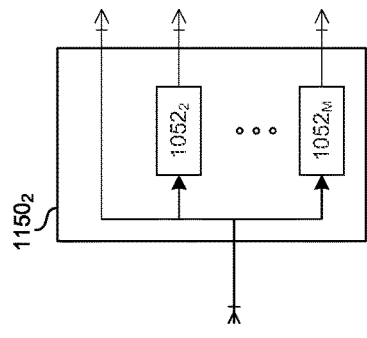

FIG. 11C shows example implementation details of circuitry of the multi-tone generator. As shown in FIG. 11C, the circuit 1002 may comprise one or more frequency multiplier circuits 1052. In the example shown, there are three circuits 1150, with one or more outputs of one or more of the circuits 1150 driving output ports of the multi-tone generator 222, one or more outputs of one or more of the circuits 1150 driving inputs of one or more others of the circuits 1150 (i.e., one or more signal paths go through a cascade of circuits 1150), and one or more outputs of one or more of the circuits 1150 driving one or more mixers of one or more circuits 1152 of FIG. 11D (i.e., one or more signal paths go through a cascade of one or more circuits 1150 and one or more circuits 1152).

In the example shown, each circuit 1150 comprises M, an integer, multiplier circuits 1052, each of which generates an output signal that is an integer multiple of its input signal (in addition to the frequency multiplication, each circuit 1052 may also perform filtering and/or other signal conditioning operations such as current and/or voltage amplification to make the output signal suitable for driving one or more of: another multiplication circuit 1052, a PLL such as 1104, mixer(s) of the circuit 1122, and/or one or more inputs of the circuit 224.

Figure 11D:
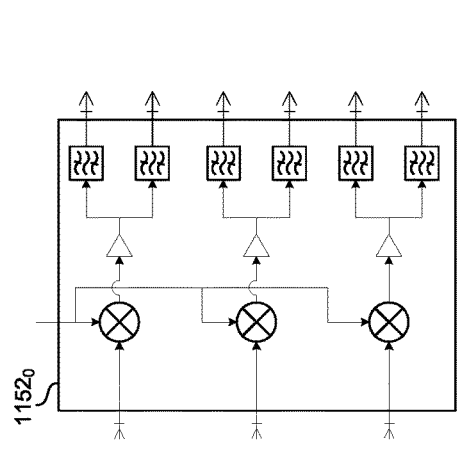
FIG. 11D shows example implementation details of circuitry of the multi-tone generator.
Figure 11D:
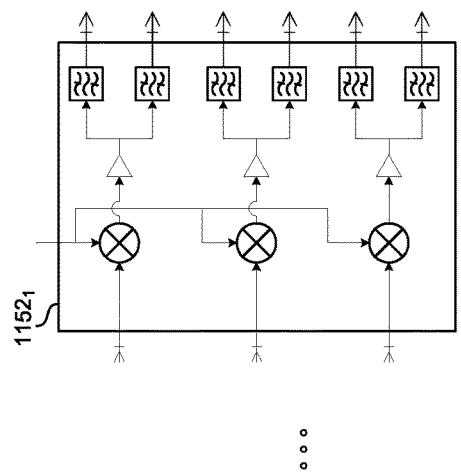
Figure 11D:
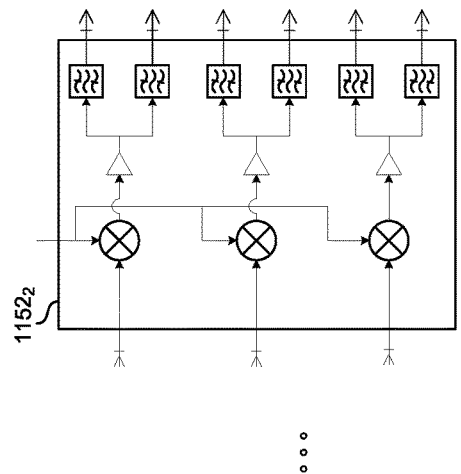

FIG. 11D shows example implementation details of circuitry of the multi-tone generator. As shown in FIG. 11C, the circuit 1122 may comprise one or more mixer circuits 1152. In the example shown, there are three circuits 1152, each generating six output signals, each of which drives an output port of the multi-tone generator 222. In one example implementation.

Through setting (either at design time or in the field using jumpers, variable resistors, switches, etc.) the multiplication factors of each multiplier 1052, the number of circuits 1150, the number of circuits 1152, and/or the interconnection of the circuits 1150 and 1152, a wide range of frequencies and channel spacings can be achieved to support a wide range of quantum processors and a wide range of quantum controllers. In one example implementation, the multipliers are configured and connected to achieve 24 output frequencies spaced at 4fi, as follows:

circuit $1150_0$ outputs:
 fi, which drives an output port of the multi-tone generator 222
 4fi, which drives the input of circuit $1150_1$, and is the basis for the frequency spacing.
 10fi, which drives an output port of the multi-tone generator 222 circuit $1150_1$ outputs:
 4fi, which drives an input of each of circuits $1152_0$, $1152_1$, and $1152_2$
 8fi, which drives an input of each of circuits $1152_0$, $1152_1$, and $1152_2$
 12fi, which drives an input of each of circuits $1152_0$, $1152_1$, and $1152_2$
 16fi, which drives an input of circuit $1150_2$ circuit $1150_2$ outputs:
 16fi, which drives an output port of the multi-tone generator 222
 32fi, which drives an input of circuit $1152_0$
 48fi, which drives an input of circuit $1152_1$
 64fi which drives an input of circuit $1152_2$
 80fi, which drives an output port of the multi-tone generator 222 circuit $1152_0$ receives 4fi, 8fi, 12fi, and 32fi and outputs 28fi, 36fi, 40fi, 24fi, 44fi, and 20fi circuit $1152_1$ receives 4fi, 8fi, 12fi, and 48fi and outputs 52fi, 44fi, 56fi, 40fi, 60fi, and 36fi circuit 11522 receives 4fi, 8fi, 12fi, and 64fi and outputs 68fi, 60fi, 72fi, 56fi, 76fi, and 52fi.

In accordance with an example implementation of this disclosure, a system comprises quantum control pulse generation circuitry (e.g., 250) and a multi-tone generator circuit (e.g., 222). The multi-tone generator is operable to generate a plurality of fixed-frequency signals from a single fixed-frequency reference signal (e.g., $223_0$-$223_7$), and output the plurality of fixed-frequency signals via a corresponding plurality of output ports (e.g., ports of 222). Each of the plurality of fixed-frequency signals may be at a different one of a plurality of frequencies from a first frequency (e.g., 2.5 GHz) to a second frequency (e.g., 6 GHz). The frequency spacing between frequency-adjacent signals of the plurality of fixed-frequency signals may be less than or equal to a range of frequencies (e.g., a range of 500 MHz) at which the quantum control pulse generation circuitry is configured to generate a pulse signal (e.g., $AO_0$) such that any frequency in the range from the first frequency to the second frequency for controlling quantum elements can be achieved through tuning of the pulse signal and mixing of the pulse signal with one of the plurality of fixed-frequency signals.

The system may comprise quantum control interconnect circuitry (e.g., 224 and/or 254) that comprises: a plurality of first input ports (e.g., $221_0$-$221_4$) for reception of quantum control pulses to be sent to one or more qubits; one or more second input ports (e.g., $229_0$-$229_4$) for reception of one or more fixed-frequency signals from the multi-tone generator; one or more first mixers (e.g., one or more of $270_0$-$270_5$) for upconversion of the quantum control pulses received via the first input ports using one or more of the fixed-frequency signals; and one or more first output ports configured to convey upconverted quantum control pulses from the first mixer to the one or more qubits. The quantum control pulse generation circuit may be operable to generate baseband pulses, and upconvert the baseband pulses to an intermediate frequency to generate the quantum control pulses, wherein the intermediate frequency is tunable over a range at least as large as the first frequency spacing. The quantum control interconnect circuitry may comprise signal routing circuitry (e.g., 224) that couples the one or more output ports of the multi-tone generator to the plurality of third input ports of the quantum control interconnect circuitry, wherein which one or more of the plurality of output ports of the multi-tone generator is connected to which one or more of the plurality of third input ports of the quantum control interconnect circuitry is different for different configurations of the signal routing circuitry. Which of the different configurations of the quantum control interconnect circuitry is used at any given time may be controllable via one or more digital control signals from the quantum control pulse generation circuit.

The quantum control interconnect circuitry may comprise a third input port (e.g., 227) for reception of quantum element readout pulses to be sent to one or more quantum element readout circuits. The quantum control interconnect circuitry may comprise a fourth input port (e.g., $229_5$) for reception of a variable-frequency signal (e.g., 231). The quantum control interconnect circuitry may comprise a second mixer (e.g., $270_0$) for upconversion of the readout pulses received via the second input port using the variable-frequency signal. The quantum control interconnect circuitry may comprise a second output port (e.g., $225_0$) configured to convey upconverted readout pulses from the second mixer to the one or more quantum element readout circuits. The quantum control interconnect circuitry may comprise a fifth input port (e.g., 227) for receiving return pulses from the one or more quantum element readout circuits. The quantum control interconnect circuitry may comprises a third mixer (e.g., $270_5$) configured to downconvert the return pulses using the variable-frequency reference signal received. The quantum control interconnect circuitry may comprise a third output (e.g., 223) configured to convey downconverted return pulses from the third mixer to the quantum control pulse generation circuitry.

The multi-tone generator may comprise a crystal oscillator (e.g., 1000), and a first signal processing circuit (e.g., 1002), wherein the crystal oscillator may be configured to generate the fixed-frequency reference signal; the first signal processing circuit may be configured to process the first fixed-frequency reference signal to generate the plurality of fixed-frequency intermediary signals; a frequency of each of the plurality of fixed-frequency signals may be an integer multiple of a frequency of the first fixed-frequency reference signal. The multi-tone generator may comprise a plurality of phase locked loops (e.g., $1104_0$-$1104_{M-1}$), and a plurality of resonators (e.g., $1120_0$-$1120_{M-1}$). Each of the phase locked loops may be configured to receive an output of a respective one of the resonators. Each of the resonators may be configured to receive an output of a respective one of the phase locked loops. The plurality of fixed frequency-signals may comprise one or more of the outputs of the resonators and/or one or more signals generated from mixing together two or more outputs of the resonators (e.g., a processing circuit 1122 coupled to outputs of the resonators). A bandwidth of the phase locked loop may be set such that phase noise of the plurality of fixed-frequency signals at frequencies below a first frequency (e.g., $f_{co}$) is a phase noise of the first signal processing circuit (e.g., represented by line 1201) and phase noise of the plurality of fixed-frequency signals at frequencies above a second frequency, equal to or higher than the first frequency, is a phase noise of the resonator circuit (e.g., represented by line 1203). One or more of the fixed-frequency intermediary signals (e.g., via a pass-through path of circuit 1122), the output of the resonator (e.g., via a pass-through path of circuit 1122), and/or one or more of the fixed-frequency signals may be coupled to a respective one or more of the plurality of output ports of the quantum control interconnect circuitry. The system may comprise a quantum control pulse generation circuit (e.g., 250) operable to generate baseband pulses, and upconvert the baseband pulses to an intermediate frequency to generate the quantum control pulses, wherein the intermediate frequency is tunable over a range at least as large as the first frequency spacing. The system may comprise signal routing circuitry (e.g., 224) that couples the plurality of output ports of the multi-tone generator the plurality of third input ports of the quantum control interconnect circuitry, wherein which one or more of the plurality of output ports of the multi-tone generator is connected to which one or more of the plurality of third input ports of the quantum control interconnect circuitry is different for different configurations of the signal routing circuitry. Which of the different configurations of the signal routing circuitry is used may be controllable via one or more digital control signals (e.g., 253 and/or 255) from the quantum control pulse generation circuit and/or a quantum programming subsystem. In an example implementations, a signal is considered "fixed frequency" if its frequency does not vary and/or is not tunable by more than 100 parts per million (ppm). In an example implementations, a signal is considered "fixed frequency" if its frequency does not vary and/or is not tunable by more than 10 parts per million (ppm). In an example implementations, a signal is considered "fixed frequency" if its frequency does not vary and/or is not tunable by more than 5 parts per million (ppm).

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure.

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
   a first circuit operable to generate a quantum control pulse; and
   a second circuit operable to generate a plurality of fixed-frequency signals, wherein:
      the quantum control pulse determines a different frequency, in a range of frequencies, for each of the plurality of fixed-frequency signals, and
      a frequency spacing between frequency-adjacent signals of the plurality of fixed-frequency signals is less than or equal to the range of frequencies.

2. The system of claim 1, wherein the first circuit is operable to:
   generate a plurality of baseband pulses; and
   upconvert the baseband pulses to an intermediate frequency to generate a plurality of quantum control pulses.

3. The system of claim 1, wherein:
   the system comprises a third circuit that comprises one or more mixers operable to upconvert the quantum control pulse using one or more of the plurality of fixed-frequency signals; and
   third circuit is operable to convey the upconverted quantum control pulses from the one or more mixers to one or more qubits.

4. The system of claim 1, wherein:
   the system is operable to route one or more of the plurality of fixed-frequency signals to a third circuit.

5. The system of claim 4, wherein the routing is controllable via one or more digital control signals.

6. The system of claim 1, wherein:
   the system comprises a third circuit that comprises an upconverter operable to upconvert a readout pulse using one or more of the plurality of fixed-frequency signals; and
   the third circuit is operable to convey the upconverted quantum readout pulse from the upconverter to a quantum element readout circuit.

7. The system of claim 6, wherein:
   the third circuit comprises a downconverter operable to downconvert a return pulse from the quantum element readout circuit.

8. The system of claim 1, wherein the second circuit comprises a crystal oscillator, a signal processor, a plurality of phase locked loops, and a plurality of resonators wherein:
   the crystal oscillator is configured to generate a first fixed-frequency intermediary signal;
   the signal processor is configured to process the first fixed-frequency intermediary signal to generate a plurality of fixed-frequency intermediary signals;
   a frequency of each of the plurality of fixed-frequency intermediary signals is an integer multiple of a frequency of the first fixed-frequency intermediary signal;
   each of the plurality of phase locked loops is configured to receive a respective one of the plurality of fixed-frequency intermediary signals and receive an output of a respective one of the plurality of resonators; and
   each of the plurality of resonators is configured to receive an output of a respective one of the plurality of phase locked loops.

9. The system of claim 8, wherein one or more outputs of the plurality of resonators are one or more of the plurality of fixed-frequency signals.

10. The system of claim 8, wherein two or more outputs of the plurality of resonators are mixed together to generate one or more of the plurality of fixed-frequency signals.

11. The system of claim 8, wherein the processing of the first fixed-frequency intermediary signal by the signal processor does not use any voltage controlled oscillators.

12. The system of claim 8, wherein the processing of the first fixed-frequency intermediary signal by the signal processor does not use any feedback loops.

13. The system of claim 8, wherein the signal processor comprises one or more mixers, one or more amplifiers, one or more filters, one or more frequency multipliers and one or more splitters.

14. The system of claim 1, wherein the second circuit comprises a crystal oscillator, a signal processor, a phase locked loop and a resonator, wherein:
   the crystal oscillator is configured to generate a first fixed-frequency intermediary signal;
   the first signal processing circuit is configured to process the first fixed-frequency intermediary signal to generate a plurality of fixed-frequency intermediary signals;
   a frequency of each of the plurality of fixed-frequency intermediary signals is an integer multiple of a frequency of the first fixed-frequency intermediary signal;
   the phase locked loop is configured to receive one of the plurality of fixed-frequency intermediary signals and an output of the resonator;
   the resonator is configured to receive an output of the phase locked loop; and
   the signal processor is configured to mix an output of the resonator and one or more of the plurality of fixed-frequency intermediary signals to generate one or more of the plurality of fixed-frequency signals.

15. The system of claim 14, wherein a bandwidth of the phase locked loop is set such that phase noise of the plurality of fixed-frequency signals at offset frequencies below a first frequency is phase noise of the signal processor, and phase noise of the plurality of fixed-frequency signals at frequencies above a second frequency, higher than the first frequency, is phase noise of the resonator.

16. The system of claim 14, wherein the processing of the first fixed-frequency intermediary signal by the signal processor does not use any voltage controlled oscillators.

17. The system of claim 14, wherein the processing of the first fixed-frequency intermediary signal by the signal processor does not use any feedback loops.

18. The system of claim 14, wherein the signal processor comprises one or more mixers, one or more amplifiers, one or more filters, one or more frequency multipliers, and one or more splitters.

19. The system of claim 14, wherein:
one or more of the plurality of fixed-frequency intermediary signals is coupled to one of a plurality of output ports of the third circuit;
the output of the resonator is coupled to one of the plurality of output ports of the third circuit; and
one or more of the plurality of fixed-frequency signals are coupled to a respective one or more of the plurality of output ports of the third circuit.

20. The system of claim 1, wherein the second circuit comprises a crystal oscillator, and a signal processor, wherein:
the crystal oscillator is configured to generate the fixed-frequency reference signal;
the signal processor is configured to process the fixed-frequency reference signal to generate the plurality of fixed-frequency signals; and
a frequency of each of the plurality of fixed-frequency signals is an integer multiple of a frequency of the fixed-frequency reference signal.

21. The system of claim 20, wherein the signal processor uses a non-linear transmission line to generate the integer multiples of the frequency of the fixed-frequency reference signal.

* * * * *